(12) United States Patent  (10) Patent No.: US 7,958,417 B2
Chakraborty et al.  (45) Date of Patent: Jun. 7, 2011

(54) APPARATUS AND METHOD FOR ISOLATING PORTIONS OF A SCAN PATH OF A SYSTEM-ON-CHIP

(75) Inventors: Tapan Chakraborty, Princeton Junction, NJ (US); Chen-Huan Chiang, Princeton Junction, NJ (US); Suresh Goyal, Warren, NJ (US); Michele Portolan, Blandshardstown (IE); Bradford G. Van Treuren, Lambertville, NJ (US)

(73) Assignee: Alcatel-Lucent USA Inc., Murray Hill, NJ (US)

( * ) Notice: Subject to any disclaimer, the term of this patent is extended or adjusted under 35 U.S.C. 154(b) by 360 days.

(21) Appl. No.: 12/022,411

(22) Filed: Jan. 30, 2008

(65) Prior Publication Data
US 2009/0193304 A1   Jul. 30, 2009

(51) Int. Cl.
*G11R 31/28* (2006.01)
(52) U.S. Cl. ....................................................... 714/726
(58) Field of Classification Search .................. 714/724, 714/726, 733, 734, 30, 729, 727; 716/4
See application file for complete search history.

(56) References Cited

U.S. PATENT DOCUMENTS

| 4,872,169 | A | 10/1989 | Whetsel |
| 6,088,822 | A | 7/2000 | Warren |
| 6,430,718 | B1 | 8/2002 | Nayak |
| 6,456,961 | B1 | 9/2002 | Patil et al. |
| 6,587,981 | B1 | 7/2003 | Muradali et al. |
| 6,631,504 | B2 * | 10/2003 | Dervisoglu et al. ............ 716/4 |
| 6,665,828 | B1 | 12/2003 | Arimilli et al. |
| 6,708,144 | B1 | 3/2004 | Merryman et al. |
| 7,006,960 | B2 | 2/2006 | Schaumont et al. |
| 7,181,705 | B2 * | 2/2007 | Dervisoglu et al. ............ 716/4 |

(Continued)

FOREIGN PATENT DOCUMENTS

JP    62 093672 A    4/1987

(Continued)

OTHER PUBLICATIONS

PCT Search Report and the Written Opinion of the International Searching Authority, or the Declaration, dated May 11, 2009, in PCT/US2009/000346, Alcatel-Lucent USA Inc., Applicant, 15 pages.

(Continued)

*Primary Examiner* — Phung M Chung
(74) *Attorney, Agent, or Firm* — Wall & Tong, LLP

(57) ABSTRACT

The invention includes an apparatus and method for dynamically isolating a portion of a scan path of a system-on-chip. In one embodiment, an apparatus includes a scan path and control logic. The scan path includes at least a first hierarchical level, where the first hierarchical level includes a plurality of components, and a second hierarchical level having at least one component. The second hierarchical level is adapted for being selected and deselected such that the second hierarchical level is active or inactive. The control logic is adapted to filter application of at least one control signal to the at least one component of the second hierarchical level in a manner for controlling propagation of data within the second hierarchical level independent of propagation of data within the first hierarchical level. In one embodiment, when the second hierarchical level is deselected, the control logic prevents data from being propagated within the second hierarchical level while data is propagated within the first hierarchical level. In one embodiment, the second hierarchical level may be used for independent, parallel testing while data continues to be propagated through the first hierarchical level.

21 Claims, 12 Drawing Sheets

U.S. PATENT DOCUMENTS

| | | |
|---|---|---|
| 7,188,330 B2 | 3/2007 | Goyal |
| 7,296,200 B2 | 11/2007 | Park et al. |
| 2003/0046015 A1 | 3/2003 | Gotoh et al. |
| 2003/0131296 A1 | 7/2003 | Park et al. |
| 2003/0131327 A1 | 7/2003 | Dervisoglu et al. |
| 2003/0145286 A1 | 7/2003 | Pajak et al. |
| 2004/0002832 A1 | 1/2004 | Chan |
| 2005/0097416 A1 | 5/2005 | Plunkett |
| 2005/0262460 A1 | 11/2005 | Goyal et al. |
| 2005/0262465 A1 | 11/2005 | Goyal |
| 2006/0179373 A1 | 8/2006 | Ishikawa |
| 2006/0282729 A1 | 12/2006 | Dastidar et al. |
| 2007/0094629 A1 | 4/2007 | Alter et al. |
| 2008/0141087 A1 | 6/2008 | Whetsel |
| 2009/0144592 A1 | 6/2009 | Chakraborty et al. |
| 2009/0144593 A1 | 6/2009 | Chakraborty et al. |
| 2009/0144594 A1 | 6/2009 | Chakraborty et al. |
| 2009/0193306 A1 | 7/2009 | Chakraborty et al. |

FOREIGN PATENT DOCUMENTS

| | | |
|---|---|---|
| WO | WO 2007/049171 A | 5/2007 |
| WO | WO 2005/078465 A | 8/2008 |

OTHER PUBLICATIONS

"IEEE Standard Test Access Port and Boundary-Scan Architecture," IEEE Std. 1149.1-2001.

IEEE 1687 IJTAG HW Proposal, 1687 Proposed Hardware Architecture Summary Update, v7.0, Jun. 25, 2007.

International Search Report and Written Opinion dated Mar. 19, 2009 in International Application No. PCT/US2008/013110, Alcatel-Lucent USA Inc., Applicant, 15 pages.

International Search Report and Written Opinion dated Mar. 19, 2009 in International Application No. PCT/US2008/013054, Alcatel-Lucent USA Inc., Applicant, 15 pages.

International Search Report and Written Opinion, dated Feb. 19, 2009, in PCT/US2008/013109, Alcatel-Lucent USA Inc., Applicant, 15 pages.

International Search Report and Written Opinion, dated Nov. 5, 2009, in PCT/US2009/000453, Alcatel-Lucent USA Inc., Applicant, 17 pages.

Melocco K et al: "A comprehensive approach to assessing and analyzing 1149.1 test logic" Proceedings International Test Conference 2003. (ITC). Charlotte, NC, Sep. 30-Oct. 2, 2003; [International Test Conference], New York, NY: IEEE, US, vol. 2, Sep. 30, 2003, pp. 40-49, XP010685379 ISBN: 978-0-7803-8106-3.

Brian Foutz et al: "Automation of IEEE 1149.6 Boundary Scan Synthesis in an ASIC methodology" Test Symposium, 2006. ATS '06. 15th Asian, IEEE, PI, Nov. 1, 2006, pp. 381-388, XP031030539 ISBN: 978-0-695-2628-7.

"Hierarchical Scan Description Language Syntax Specification," ASSET InterTech, Inc. 1997.

IEEE Standard VHDL Language Reference Manuel, IEEE Std. 1076, 2000 Edition.

Rearick, J., et al., "IJTAG (Internal JTAG): A Step Toward a DFT Standard," 2005, IEEE pp. 1-10.

Carlsson, G., et al., "Protocol Requirements in an SJTAG/IJTAG Environment," 2007, IEEE, pp. 1-9.

Crouch, A., et al., "IJTAG: The Path to Organized Instrument Connectivity," 2007, IEEE, pp. 1-10.

Eklow, B., et al., "Microsoft Power Point—ETS06—IJTAG-Embedded-Tutorial-v2," May 23, 2006, IEEE P1687 (IJTAG), pp. 1-42.

\* cited by examiner

APPARATUS AND METHOD FOR ISOLATING PORTIONS OF A SCAN PATH OF A SYSTEM-ON-CHIP

FIELD OF THE INVENTION

The invention relates to the field of electronics and, more specifically, to testing of printed circuit boards, system-on-chips, and systems.

BACKGROUND OF THE INVENTION

Joint Test Action Group (JTAG) refers to the IEEE 1149 standard for test access ports for testing printed circuit boards using boundary scan. JTAG is used by Automated Test Generation (ATG) tools to test printed circuit boards. Instrument JTAG (IJTAG) is now being standardized (as the IEEE P1687 standard) to overcome existing JTAG limitations associated with the move from board-level JTAG to chip-level JTAG. IJTAG proposes inclusion of dynamic hierarchical paths inside data registers using dynamic hierarchical cells such as the cell referred to as the Select Instrument Bit (SIB) cell. The use of dynamic hierarchical paths enables portions of the scan path to be turned on and off as needed. The dynamic hierarchical paths that are enabled by use of cells like the SIB are a valuable testing resource because, as the number of elements in the scan path is important in determining testing time, careful use of hierarchy may be used to reduce testing time.

As described in the proposed IEEE P1687 standard, the scan chain is a linear scan chain and each SIB cell that is inserted into the scan chain is inserted in order to introduce hierarchy into the scan chain. As such, since the scan chain is a linear chain, and each SIB cell included in the linear scan chain must be accessed linearly via the scan chain in order to activate hierarchy in the scan chain, the length of the scan chain directly determines the amount of access time needed to modify and exercise the active hierarchy. While this limitation may seem insignificant in examples in which the scan chain only includes a few cells, this may be a significant limitation in real-life systems where the scan chain may include hundreds or even thousands of cells. While the impact of this problem may be reduced by use of accurate scheduling of testing procedures, this problem simply cannot be completely avoided by use of scheduling of testing procedures.

SUMMARY OF THE INVENTION

Various deficiencies in the prior art are addressed through apparatuses and associated methods for dynamically isolating portions of a scan path of a system-on-chip.

In one embodiment, an apparatus includes a scan path and control logic. The scan path includes at least a first hierarchical level, where the first hierarchical level includes a plurality of components, and a second hierarchical level having at least one component. The second hierarchical level is adapted for being selected and deselected such that the second hierarchical level is active or inactive. The control logic is adapted to filter application of at least one control signal to the at least one component of the second hierarchical level in a manner for controlling propagation of data within the second hierarchical level independent of propagation of data within the first hierarchical level. In one embodiment, when the second hierarchical level is deselected, the control logic prevents data from being propagated within the second hierarchical level while data is propagated within the first hierarchical level. In one embodiment, the second hierarchical level may be used for independent, parallel testing while data continues to be propagated through the first hierarchical level.

In one embodiment, a method for testing a system-on-chip having a scan path comprising a first hierarchical level and a second hierarchical level includes selecting the second hierarchical level of the scan path to add the second hierarchal level to the scan path, propagating at least one input value of an input bitstream into the second hierarchical level via at least a portion of the first hierarchical level, deselecting the second hierarchical level of the scan path to isolate the second hierarchical level from the scan path, performing a test via the second hierarchical level using the at least one input value to generate at least one output value, wherein the test is performed independent of propagation of additional input values through the first hierarchical level, reselecting the second hierarchical level of the scan path to add the second hierarchical level to the scan path, and propagating the at least one output value out of the second hierarchical level via at least a portion of the first hierarchical level.

BRIEF DESCRIPTION OF THE DRAWINGS

The teachings of the present invention can be readily understood by considering the following detailed description in conjunction with the accompanying drawings, in which.

To facilitate understanding, identical reference numerals have been used, where possible, to designate identical elements that are common to the figures.

DETAILED DESCRIPTION OF THE INVENTION

Apparatuses and methods are provided that enable isolation of different hierarchical layers of a scan path using control logic. In a system-on-chip having a scan path including a first hierarchical level and a second hierarchical level, where the second hierarchical level may be dynamically selected and deselected (to activate/deactivate the second hierarchical level such that it may be dynamically added to and removed from the active scan path), filtering control logic enables filtering of control signals in a manner for controlling propagation of data within the second hierarchical level independent of propagation of data within the first hierarchical level.

The filtering control logic filters control signals that are normally applied to all components of the scan path such that application of the control signals to components of the second hierarchical level is modified (without modifying application of the control signals to components of the first hierarchical level). In this manner, when the second hierarchical level is deselected, bitstream values are prevented from being propagated within the second hierarchical level while bitstream values continue to be propagated through the first hierarchical level. Thus, the second hierarchical level is effectively isolated from the scan path (i.e., completely deactivated such that no data propagates within the second hierarchical level) while the second hierarchical level is deselected.

Although primarily depicted and described herein with respect to a scan path having two hierarchical levels, the different data propagation control functions described herein may be applied to scan paths having any number of hierarchical levels which may be arranged in any configuration (e.g., using nesting, parallel arrangements, and the like, as well as various combinations thereof).

Figure 1:
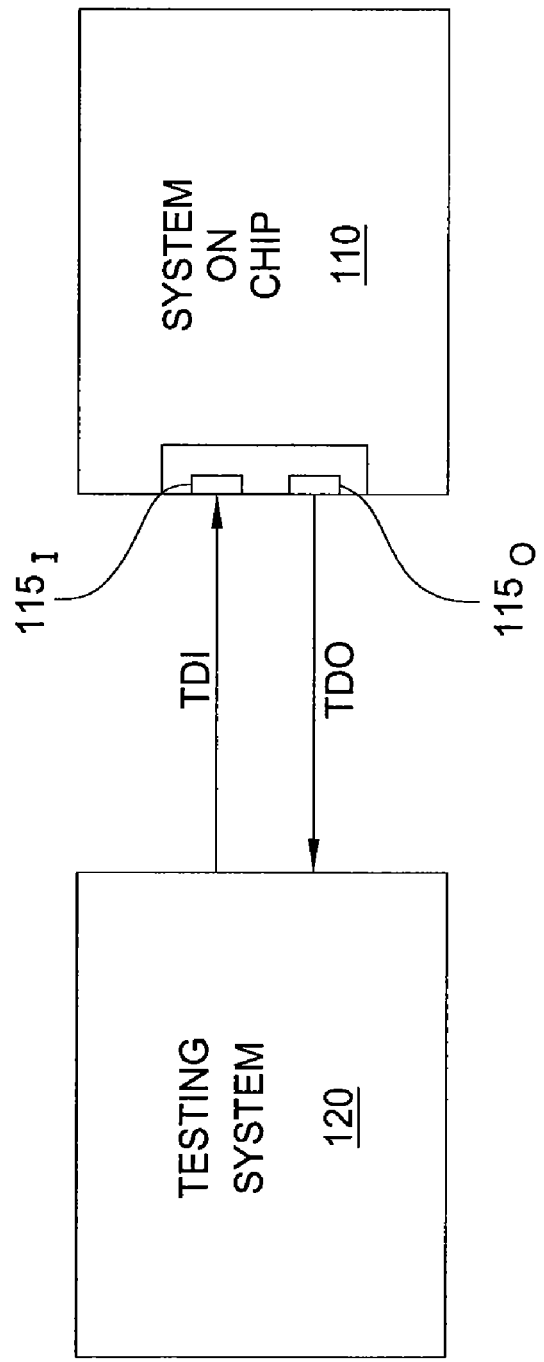
FIG. 1 depicts a high-level block diagram of a testing environment.

FIG. 1 depicts a high-level block diagram of a testing environment. Specifically, testing environment 100 includes a system-on-chip (S-o-C) 110 and a testing system (TS) 120. The TS 120 tests S-o-C 110 (e.g., testing individual components of S-o-C 110 (including functions of components), interconnections between devices on S-o-C 110, system level functions of S-o-C 110, and the like, as well as various combinations thereof). The TS 120 tests S-o-C 110 using a system scan path that includes multiple hierarchical levels. As depicted in FIG. 1, TS 120 interfaces with S-o-C 110 using a test access interface 115 including an input port 115$_I$ (TDI) and an output port 115$_O$ (TDO).

In one embodiment, in an environment according to the proposed IEEE P1687 standard, interface 115 may be implemented as a Test Access Port (TAP) as defined by the IEEE 1149.1 standard. In one such embodiment, although primarily depicted and described herein using the TDI/TDO ports, interface 115 may include other control ports, such as TCK ports, TMS ports, TRST ports, and the like, as well as other new control interfaces which may be required (which have been omitted for purposes of clarity). Although primarily depicted and described herein with respect to an interface implemented as modified versions of the TAP defined by the IEEE 1149.1 standard, the interface 115 may be implemented in various other ways.

The TS 120 performs testing on S-o-C 110 using test procedures. The TS 120 may perform one or more tests using one or more test procedures. A test procedure may be used to test a portion of a component (e.g., a function of a component, a set of functions of a component, dependencies, and the like), a component, a group of components (e.g., interconnections between components, inter-component dependencies, and the like), one or more system level functions, and the like, as well as various combinations thereof. A test procedure(s) may be used to perform any other type of testing which may be performed on a system-on-chip.

The TS 120 generates a test procedure to test S-o-C 110. The test procedure specifies information required to test S-o-C 110. A test procedure for S-o-C 110 may specify a description of S-o-C 110 (including descriptions of each of the individual components of S-o-C 110, as well as a system level description of S-o-C 110). A test procedure may specify an input testing vector (to be applied to the scan path) and an expected output testing vector (expected to be received from the testing scan path). A test procedure may also specify a control signal or signals (to be applied to the system-on-chip). A test procedure may include any other information associated with a test (e.g., an estimated time required for the test, output data handling for the test, the like, as well as various combinations thereof).

The TS 120 tests S-o-C 110 by executing one or more test procedures on S-o-C 110. The TS 120 generates input testing bitstreams and expected testing results (e.g., expected output bit values or bitstreams) for each test to be performed. The TS also generates control signals. The TS 120 applies the input testing bitstreams (i.e., input test vectors) to TDI input port 115$_I$. The TS 120 receives corresponding output testing bitstreams (referred to as output test vectors) from TDO output port 115$_O$. The TS 120 compares the output testing bitstreams to the expected testing results in order to determine the results of the test.

The TS 120 may handle testing results from executed test procedures in any manner. In various embodiments, for example, TS 120 may present the testing results via a display interface, store the testing results in memory, propagate the testing results to one or more other systems, and the like, as well as assorted combinations thereof. The TS 120 may handle the testing results from executed test procedures in any other manner. The TS 120 may also handle some or all of the inputs to the testing in a similar manner (e.g., presenting, storing, propagating, and the like, as well as various combinations thereof).

The TS 120 may execute one or more test procedures to test S-o-C 110. The TS 120 may organize execution of multiple test procedures in a manner that tends to minimize a total test time required for performing a test (since different scheduling decisions will result in different testing completion times for the same set of test procedures). The TS 120 may specify a testing schedule (i.e., a schedule specifying an order according to which the different test procedures must be executed). The TS 120 may perform various other functions associated with testing of a system-on-chip.

Figure 2:
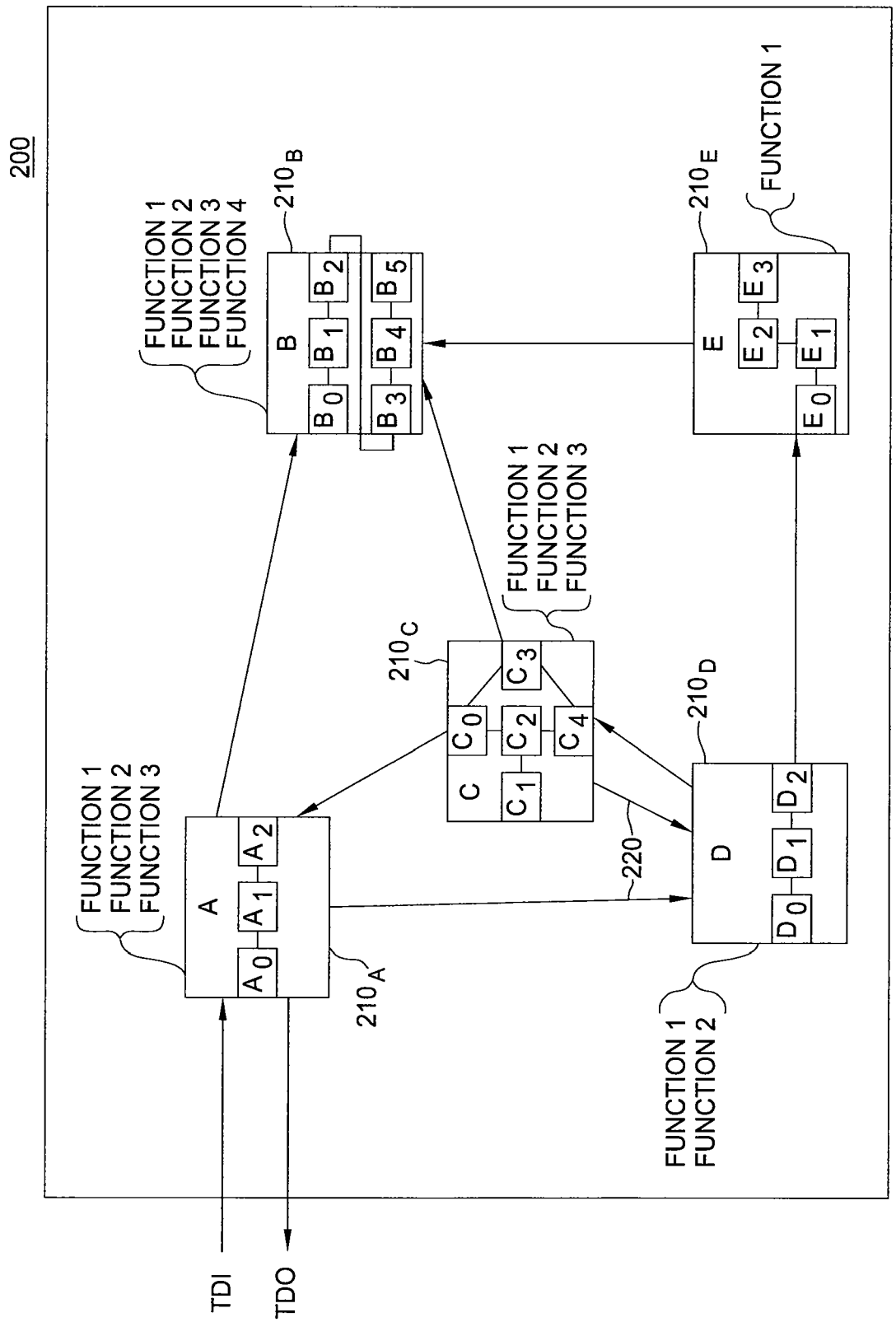
FIG. 2 depicts a high-level block diagram of an exemplary system-on-chip adapted for use in the testing environment of FIG. 1.

FIG. 2 depicts a high-level block diagram of an exemplary system-on-chip adapted for used in the testing environment of FIG. 1. The S-o-C 200 of FIG. 1 is an example of S-o-C 110 of FIG. 1. As depicted in FIG. 2, S-o-C 200 includes a plurality of components 210$_A$-210$_E$ (collectively, components 210) which are interconnected by a plurality of component interconnections 220 (collectively, component interconnections 220). It will be understood that the S-o-C 200 depicted and described with respect to FIG. 2 merely constitutes one example of a system-on-chip (i.e., S-o-C 200 may include various other components that may be configured in various other ways).

As depicted in FIG. 2, each component 210 includes a plurality of internal registers. Specifically, component 210$_A$ includes three registers ($A_0$, $A_1$, $A_2$), component 210$_B$ includes six registers ($B_0$, $B_1$, $B_2$, $B_3$, $B_4$, $B_5$), component 210$_C$ includes five registers ($C_0$, $C_1$, $C_2$, $C_3$, $C_4$), component 210$_D$ includes three registers ($D_0$, $D_1$, $D_2$), and component 210$_E$ includes four registers ($E_0$, $E_1$, $E_2$, $E_3$). The registers of each component 210 form an internal scan path for that component 210.

As depicted in FIG. 2, each component 210 supports at least one function. Specifically, component 210$_A$ supports three functions, component 210$_B$ supports four functions, component 210$_C$ supports three functions, component 210$_D$ supports two functions, and component 210$_E$ supports one function. The functions supported by each of the components 210 make use of the registers (i.e., the internal scan paths) of each of the components 210, respectively.

As depicted in FIG. 2, components 210 of S-o-C 200 are connected via the component interconnections 220 of S-o-C 200. The components 210 (i.e., internal scan paths of the components 210) and component interconnections 220 between components 210 form a testing scan path from the input test port (TDI) of S-o-C 200 to the output test port (TDO) of S-o-C 200.

The components 210 include any components which may be included in a system-on-chip system. In one embodiment, in a system implemented according to the proposed IEEE P1687 standard, components 210 may include IP devices and/or instruments. In that IPs/instruments may be quite similar, the two terms may be used interchangeably herein. Further, since IPs and instruments may be used as components of a system-on-chip, IPs and instruments may be more generally referred to herein as components. In other embodiments, in systems according to other standards, components 210 may include other types of components.

An IP device is a device requiring testing. An instrument is a device which, apart from requiring testing, offers functionality adapted for helping testing (e.g., reading values, monitoring values, and the like, as well as various combinations thereof). For example, an instrument may be an output of a temperature sensor to be used to parameterize lifetime-acceleration testing. For example, an instrument may be the reference value of a sensor used for calibrating a tunable filter for the acquisition stage of a software-defined radio. Thus, instruments may help testing both during initial system testing, as well as throughout the lifetime of the system.

The components 210 may include one or more hierarchy-enabling components. A hierarchy-enabling component is a component that supports dynamic modification of the scan path of the system-on-chip (e.g., by dynamically activating/deactivating one or more hierarchical levels of additional components of the testing scan path of the system-on-chip). In general, hierarchy improves testing of components of a system-on-chip. For example, hierarchy enables minimization of the active system scan path and isolation of components during testing, thereby reducing access time to components of a system-on-chip). The use of hierarchy-enabling components may be better understood with respect to FIG. 3.

Figure 3:
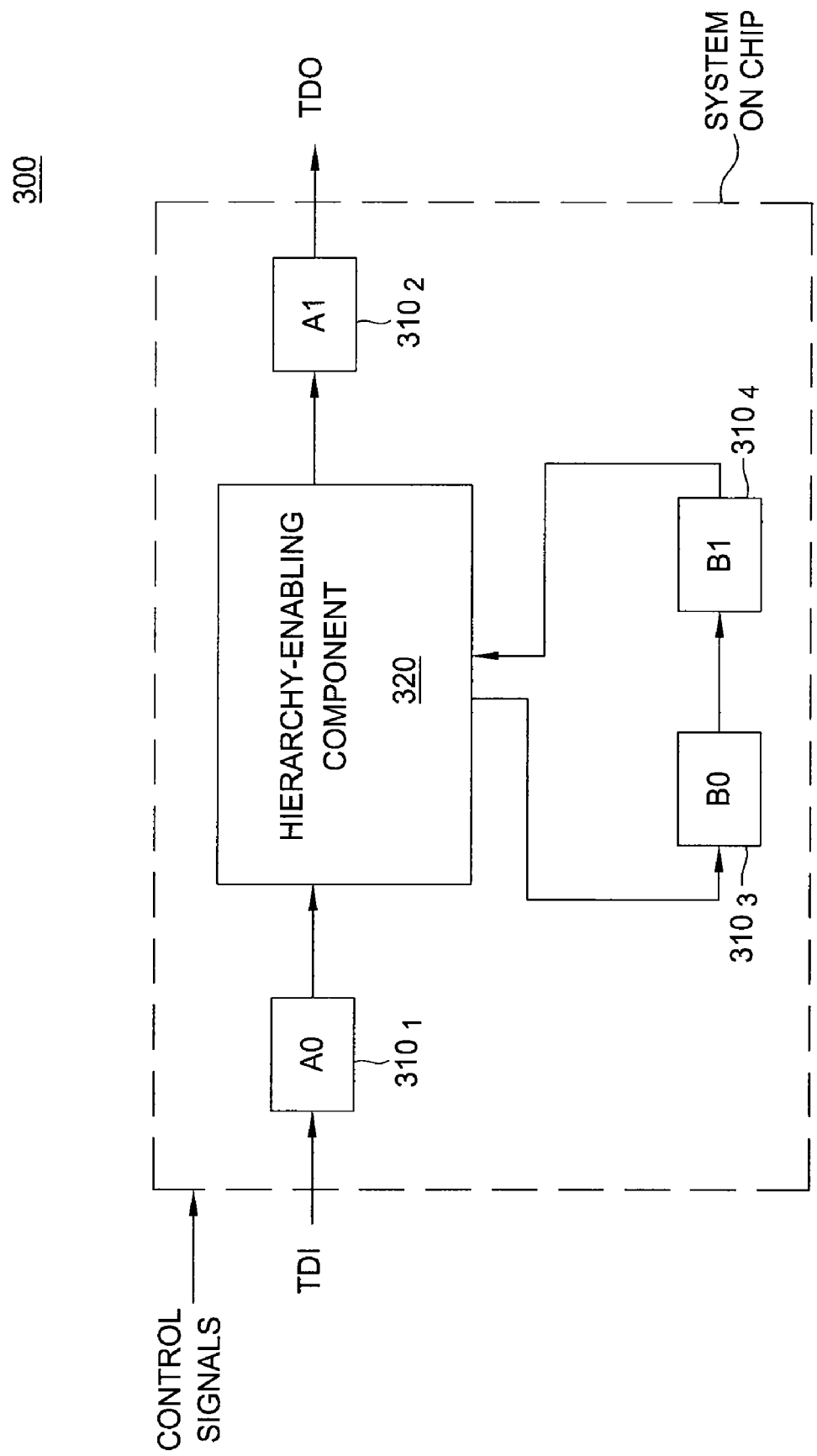
FIG. 3 depicts a high-level block diagram of an exemplary system-on-chip with a hierarchical scan path including two hierarchical levels controlled by a hierarchy-enabling component.

FIG. 3 depicts a high-level block diagram of an exemplary system-on-chip with a hierarchical scan path including two hierarchical levels controlled by a hierarchy-enabling component. Specifically, the system-on-chip 300 of FIG. 3 includes a first testing component $310_1$ (denoted as component A0) and a second testing component $310_2$ (denoted as component A1) interconnected via a hierarchy-enabling component 320 that dynamically controls access to a third testing component $310_3$ (denoted as component B0) and a fourth testing component $310_4$ (denoted as component B1). The first and second testing components $310_1$ and $310_2$, and the hierarchy-enabling component 320, form a first hierarchical level of the testing scan path. The third and fourth testing components $310_3$ and $310_4$ form a second hierarchical level of the testing scan path.

The hierarchy-enabling component 320 can be selected to activate the second hierarchical level of the scan path (i.e., to add the second hierarchical level to the active scan path) and can be deselected to deactivate the second hierarchical level of the scan path (i.e., to remove the second hierarchical level from the active scan path). For example, the when hierarchy-enabling component 320 is deselected, hierarchy-enabling component 320 operates as a pass-through component such that the scan path includes: TDI→A0→HC→A1→TDO. For example, when hierarchy-enabling component 320 is selected, hierarchy-enabling component 320 activates the second hierarchical level of the scan path such that the scan path includes the following sequence: TDI, A0, HC, B0, B1, HC, A1, TDO. The hierarchy-enabling component 320 may be implemented in any manner adapted for dynamically modifying a scan path of a system-on-chip.

The hierarchy-enabling component 320 may be any component adapted for supporting dynamic modification of a scan path (i.e., for activating and deactivating a hierarchical level of the scan path). In one embodiment, for example, the hierarchy-enabling component 320 may include a select instrument bit (SIB) as defined in the proposed IEEE P1687 standard (or a modified version of the SIB defined in the proposed IEEE P1687 standard, depending on implementation of the control logic for filtering control signals for preventing bitstream values being propagated through a first hierarchical level of the scan path from being propagated through a second hierarchical level of the scan path while the second hierarchical level of the scan path is deselected).

The hierarchy-enabling component 320 may be a more complex hierarchy-enabling component (referred to herein as crossroad devices) supporting dynamic modification of a scan path. For purposes of clarity in describing use of control logic for filtering bitstream values being propagated through a first hierarchical level of the scan path from being propagated through a second hierarchical level of the scan path, filtering control logic is primarily depicted and described herein within the context of embodiments in which the dynamic hierarchy of the system-on-chip is provided using an SIB cell as defined in the proposed IEEE P1687 standard (or a modified version of the SIB, depending on implementation of the control logic).

Figure 4:
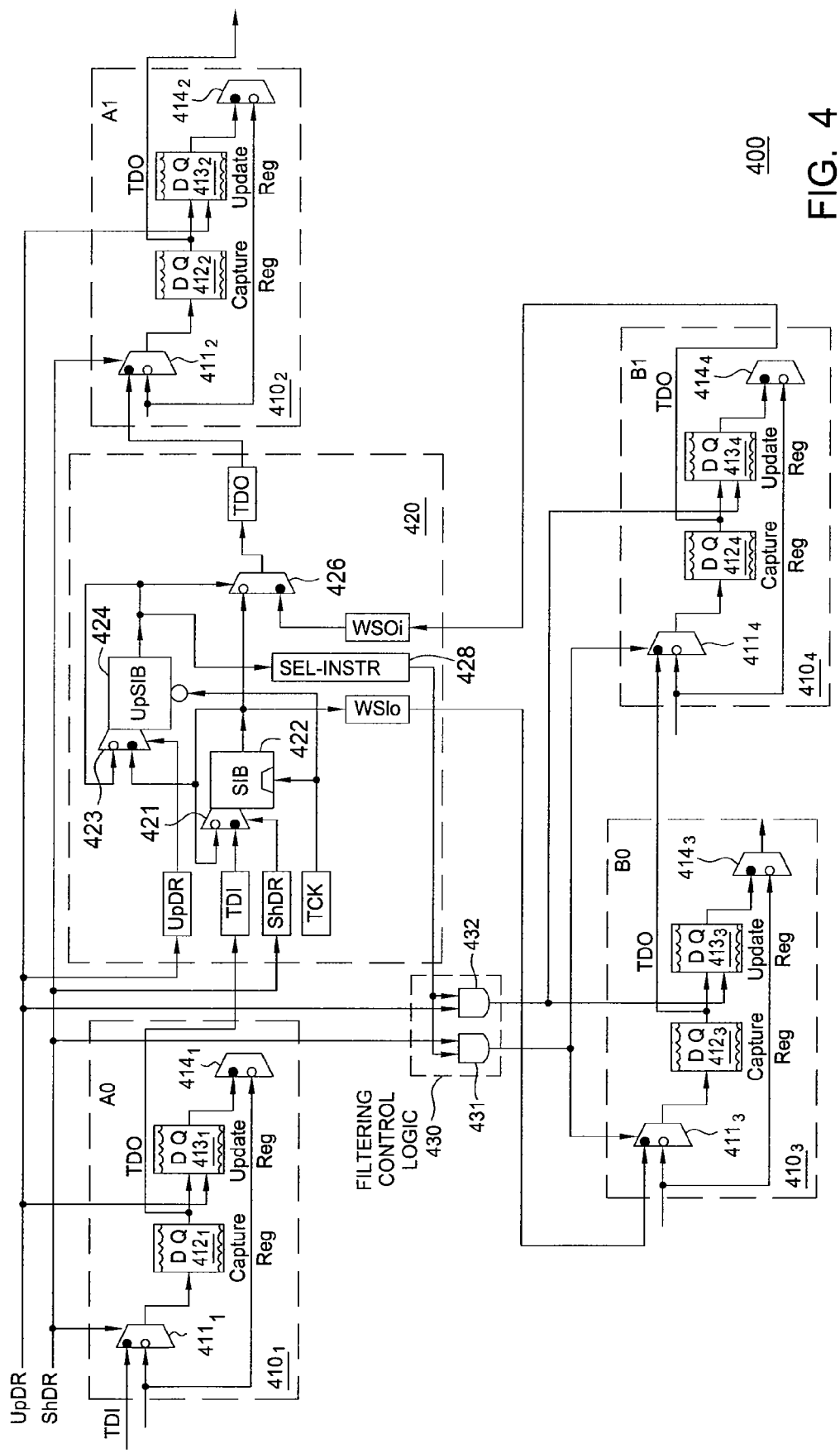
FIG. 4 depicts a high-level block diagram of an exemplary system-on-chip with a hierarchical scan path including two hierarchical levels controlled by a hierarchy-enabling component and filtering control logic.

FIG. 4 depicts a high-level block diagram of an exemplary system-on-chip with a hierarchical scan path including two hierarchical levels controlled by a hierarchy-enabling component and filtering control logic. The system-on-chip 400 includes an implementation of system-on-chip 300 of FIG. 3. As depicted in FIG. 4, non-hierarchy-enabling components $310_1$-$310_4$ are implemented as boundary scan cells $410_1$-$410_4$ (collectively, boundary scan cells 410), hierarchy-enabling component 320 is implemented as an SIB cell 420 as defined in the proposed IEEE P1687 standard, and, further, additional logic (illustratively, filtering control logic 430) is provided for filtering control signals in a manner that prevents bitstream values from being propagated through the second hierarchical level of the scan path (while the second hierarchical level is deselected) while bitstream values continue to be propagated through the first hierarchical level of the scan path.

For purposes of clarity in depicting propagation of bitstreams through the components of system-on-chip 400, each multiplexer supporting multiple input ports has been marked in a manner for distinguishing between which input port of the multiplexer is selected when a "0" is applied to the control port of the multiplexer and which input port of the of the multiplexer is selected when a "1" is applied to the control port of the multiplexer. Specifically, each input port to a multiplexer that is shaded in FIG. 4 denotes the input port that is selected to pass to the output of the multiplexer when a "1" is applied to the control port of the multiplexer (and the un-shaded input port denotes the input port that is selected to pass to the output of the multiplexer when a "0" is applied to the control port of the multiplexer).

As depicted in FIG. 4, each boundary scan cell 410 is a standard IEEE 1149.1 boundary scan cell supporting a scan path from a TDI input to a TDO output and an additional data path from a second input to a second output. The boundary scan cells $410_1$-$410_4$ include a respective plurality of input MUXs $411_1$-$411_4$ (collectively, input MUXs 411), a respective plurality of capture registers $412_1$-$412_4$ (collectively, capture registers 412), a respective plurality of update registers 413₁-413₄ (collectively, update registers 413), and a respective plurality of output MUXs 414₁-414₄ (collectively, output MUXs 414).

In each boundary scan cell 410, propagation of signals along the scan path from the TDI input of the boundary scan cell to the TDO output of the boundary scan cell is performed using input MUX 411, capture register 412 update register 413, and output MUX 414. The scan path of each boundary scan cell 410 forms part of the scan path of system-on-chip 400. In each boundary scan cell 410, propagation of signals along the additional data path from the second input to the second output either uses a first path from the second input to the output MUX 414 or a second path that uses input MUX 411, capture register 412 update register 413, and output MUX 414. The additional data path supported by each boundary scan cell 410 may be used for other testing purposes (e.g., testing instruments, testing interconnections between components, and the like, as well as various combinations thereof).

A description of each boundary scan cell 410 follows.

In each boundary scan cell 410, the input MUX 411 includes two input ports: a first input port coupled to the TDI input (e.g., from the output of the previous component in the scan chain, such as from the output of a capture register of a boundary scan cell, from the TDO output of an SIB cell, or any other similar scan path signal) and a second input port coupled to the second input of the additional data path (which may be coupled in many ways, as desired/needed). The selection of the input signal that is passed through the input MUX 411 to the output of the input MUX 411 is controlled by a common Shift DR (ShDR) control signal that is applied to each component of system-on-chip 400. In each boundary scan cell 410, when the ShDR control signal is "1" the input signal from the first input of the input MUX 411 is propagated to the capture register 412, and when the ShDR control signal is "0" the input signal from the second input of the input MUX 411 is propagated to the capture register 412.

In each boundary scan cell 410, the output of the input MUX 411 is coupled to an input to the capture register 412 (i.e., each signal that is passed through input MUX 411 is stored in capture register 412). The output of capture register 412 is coupled to both the TDO output of that boundary scan cell 410 and to the input to the update register 413. The update register 413 is controlled by a common Update DR (UPDR) control signal that is applied to the clock input of each register of system-on-chip 400. In one embodiment, in each boundary scan cell 410, when there is a rising edge on UpDR, the signal from the output of the capture register 412 is propagated to the update register 413 (i.e., the value that was previously stored in the capture register 412 is stored in the update register 413), and when the UpDR control signal is "0" the signal from the output of the capture register 412 (which is always propagated to the TDO output) is not propagated to the update register 413. The output of the update register 413 is coupled to a first input of the output MUX 414.

In each boundary scan cell 410, the output MUX 414 includes two input ports: a first input port coupled to the output of the update register 413 and a second input port coupled to the second input of the additional data path (which may be coupled in many ways, as desired/needed). The selection of the input signal that is passed through the output MUX 414 to the output of the output MUX 414 is controlled by a common Mode control signal that is applied to each boundary scan cell 410 of system-on-chip 400. In each boundary scan cell 410, when the Mode control signal is "0" the input signal from the first input port of the output MUX 414 (i.e., the output of the update register 413) is propagated to the second output of boundary scan cell 410, and when the Mode control signal is "1" the input signal from the second input port of the output MUX 414 (i.e., the second input of the additional data path) is propagated to the second output of boundary scan cell 410.

As depicted in FIG. 4, the SIB cell 420 is a standard SIB cell as defined in the proposed IEEE P1687 standard. The SIB cell 420 supports a first hierarchical level of the scan path (via a TDI input and a TDO output) and a second hierarchical level of the scan path (via a WSIo port which is coupled to the TDI input of boundary scan cell B0 and a WSOi port which is coupled to the TDO output from boundary scan cell B1). The SIB cell 420 includes a Select Instrument Bit (SIB) register 422, an Update SIB (UpSIB) register 424, and an output MUX 426. The SIB register 422 has an associated SIB input MUX 421. The UpSIB register 424 has an associated UpSIB input MUX 423.

The SIB input MUX 421 associated with the SIB register 422 controls input to SIB register 422. The SIB input MUX 421 includes two input ports. The SIB input MUX 421 accepts as inputs the TDI input (e.g., from a previous component in the scan path) and the output of the SIB register 422. The SIB input MUX 421 is controlled by the ShDR control signal, which is applied to a control port of the SIB input MUX 421. When the ShDR control signal is "1", SIB input MUX 421 passes the signal from the TDI input into SIB register 422. When the ShDR control signal is "0", SIB input MUX 421 passes the signal from the output of SIB register 422 into SIB register 422.

The SIB register 422 accepts input from the output of SIB input MUX 421. The SIB register 422 is controlled by a clock signal (denoted as TCK) applied to a clock port of SIB register 422. The output of the SIB register 422 is coupled to each of the following: an input to the SIB input MUX 421, an input to the UpSIB input MUX 423, an input to the output MUX 426, and the WSIo port (which provides access to components of the second (or lower) hierarchical level for propagating signals to and within the second hierarchical level when the second hierarchical level is of the scan path is activated).

The UpSIB input MUX 423 associated with the UpSIB register 424 controls input to UpSIB register 424. The UpSIB input MUX 423 includes two input ports. The UpSIB input MUX 423 accepts as inputs the output from the SIB register 422 and the output from the UpSIB register 424. The UpSIB input MUX 423 is controlled by the UpDR control signal applied to a control port of the UpSIB input MUX 423. When the UpDR control signal is "1", UpSIB input MUX 423 passes the signal from the output of SIB register 422 into UpSIB register 424. When the UpDR control signal is "0", UpSIB input MUX 423 passes the signal from the output of UpSIB register 424 into UpSIB register 424.

The UpSIB register 424 accepts input from the output of UpSIB input MUX 423. The UpSIB register 424 is controlled by a clock signal (denoted as TCK) applied to a clock port of UpSIB register 424. The output of the UpSIB register 424 is coupled to each of the following: an input to the UpSIB input MUX 423, a control port of the output MUX 426, and a Select_Instr signaling path (which is coupled to the filtering control logic 430 for use in filtering application of the ShDR and UpDR control signals to components of the second (or lower) hierarchical level in a manner that effectively isolates components of the second hierarchical level from the scan path).

The output MUX 426 includes two input ports. The output MUX 426 accepts as inputs the output from the SIB register 422 and the input from the lower hierarchical level via the WSOi port (which, in this example, is the TDO output of boundary scan cell B1). The output of output MUX 426 is coupled to the TDO output of SIB cell 420 (for propagation to a subsequent component in the first hierarchical level of the scan path, which, in this example, is boundary scan cell A1). The output of output MUX 426 is determined by a control signal applied to a control port of the output MUX 426. The output of the UpSIB register 424 is coupled to the control port of output MUX 416.

As depicted in FIG. 4, the value of UpSIB register 424 determines whether the second hierarchical level is selected (i.e., part of the scan path) or deselected (i.e., not part of the scan path). When the second hierarchical level is deselected (i.e., the value of UpSIB register 424 is "0") the output MUX 426 passes the output of the SIB register 422 to the TDO output of SIB cell 420, and the value from the WSOi port is ignored. When the second hierarchical level is selected (i.e., the value of UpSIB register 424 is "1"), output MUX 426 passes the signal from the lower hierarchical level (i.e., from the WSOi port) to the TDO output of SIB cell 420.

As depicted in FIG. 4, in addition to the ShDR control signal and the UpDR control signal being applied to each of the boundary scan cells 410 and the SIB cell 420, the ShDR control signal and the UPDR control signal are also each applied to the filtering control logic 430. As further depicted in FIG. 4, the output of the UpSIB register 424 of SIB cell 420 is coupled to filtering control logic 430 to filter the application of the ShDR control signal and the UpDR control signal to the components of the second hierarchical level (i.e., boundary scan cells 420₃ and 420₄), thereby preventing bitstream values that are being propagated through the first hierarchical layer of the scan path (i.e., A0→SIB→A1) from being propagated through the second hierarchical level of the scan path (i.e., SIB→B0→B1→SIB) while the second hierarchical level of the scan path is deselected (i.e., while the UpSIB register 424 of SIB cell 420 is set to "0").

The filtering control logic 430 includes a first AND gate 431 adapted for filtering the ShDR control signal in the second hierarchical level. The first AND gate 431 includes a first input port (coupled to the ShDR control signal) and a second input port (coupled to a hierarchy selection control signal (e.g., in the example of FIG. 4 the output of the UpSIB register 424 of SIB cell 420)). As depicted in FIG. 4, the output port of first AND gate 431 is coupled to the control ports of the respective input MUXs 411 of each of the components of the second hierarchal level (i.e., the input MUXs 411₃ and 411₄ of boundary scan cells 410₃ and 410₄, respectively), rather than the ShDR control signal being applied directly to the control ports of the respective input MUXs of each of the components of the second hierarchical level).

For example, in existing systems which do not include filtering control logic, since the ShDR control signal had to be activated in order to propagate bitstreams through the components of the first hierarchical level (i.e., through the scan path) and, further, since the ShDR control signal was applied to all of the components of the scan path (including the components of the second hierarchical level), bitstreams could not be propagated through the first hierarchical level of the system-on-chip without also propagating the bitstreams through the second hierarchical level of the system-on-chip (even where that second hierarchical levels was deselected using the UpSIB register of the associated SIB cell).

In the system-on-chip 400 of FIG. 4, however, since the value of UpSIB register 424 is "0" when the second hierarchical level is deselected, the first AND gate 431 ensures that, as long as the second hierarchical level is deselected (i.e., as long as the value of the UpSIB register 424 is "0"), the output of first AND gate 431 will be "0" and, thus, the value of the control signal applied to the control ports of the respective input MUXs 411 of the components of the second hierarchical level will be "0", thereby preventing propagation of bitstreams through the components of the second hierarchical level (i.e., through boundary scan cells 410₃ and 410₄) when bitstreams are being propagated through components of the first hierarchical level.

As depicted in FIG. 4, when the second hierarchical level is deselected, the first AND gate 431 prevents propagation of data from the TDI input of boundary scan cell 410₃ to capture register 412₃ of boundary scan cell 410₃ and, similarly, prevents propagation of data from the TDI input of boundary scan cell 410₄ to capture register 412₃ of boundary scan cell 410₃. In other words, data values stored in the respective capture registers of components of the second hierarchical level (i.e., boundary scan cells 410₃ and 410₄) remain unchanged even as a bitstream continues to be propagated through the first hierarchical level. This may be better understood with respect to the example of FIG. 5.

The filtering control logic 430 includes a second AND gate 432 adapted for filtering the UpDR control signal in the second hierarchical level. The second AND gate 432 includes a first input port (coupled to the UpDR control signal) and a second input port (coupled to the hierarchy selection control signal (e.g., in the example of FIG. 4 the output of the UpSIB register 424 of SIB cell 420)). As depicted in FIG. 4, the output port of second AND gate 432 is coupled to the control ports of the respective update registers 413 of each of the components of the second hierarchal level (i.e., the updated registers 413₃ and 413₄ of boundary scan cells 410₃ and 410₄, respectively), rather than the UpDR control signal being applied directly to the control ports of the respective update registers of each of the component of the second hierarchical level).

For example, in existing systems which do not include filtering control logic, since the UPDR control signal had to be activated in order to propagate bitstreams through the components of the first hierarchical level (i.e., through the additional data path to be output via the second output) and, further, since the UpDR control signal was applied to all components of the scan path (including components of the second hierarchical level), bitstreams could not be propagated through the first hierarchical level of the system-on-chip without also propagating the bitstreams through the second hierarchical level of the system-on-chip 400 (even where the second hierarchical level was deselected using the UpSIB register of the associated SIB cell).

In the system-on-chip 400 of FIG. 4, however, since the value of UpSIB register 424 is "0" when the second hierarchical level is deselected, the second AND gate 432 ensures that, as long as the second hierarchical level is deselected (e.g., as long as the value of UpSIB register 424 is "0"), the output of the second AND gate 432 will be "0" and, thus, the value of the control signal applied to the control ports of the respective update registers 413 of the components of the second hierarchical level will be "0", thereby preventing propagation of bitstreams through the components of the second hierarchical level (i.e., through boundary scan cells 410₃ and 410₄) when bitstreams are being propagated through components of the first hierarchical level.

As depicted in FIG. 4, when the second hierarchical level is deselected, the second AND gate 432 prevents propagation of data from capture register 412₃ to update register 413₃ of boundary scan cell 410₃ and, similarly, prevents propagation of data from capture register 412₄ to update register 413₄ of boundary scan cell 410₄. In other words, data values stored in the respective update registers of components of the second hierarchical level (i.e., boundary scan cells 410₃ and 410₄) remain unchanged even as a bitstream continues to be propagated through the first hierarchical level. This may be better understood with respect to the example of FIG. 5.

Thus, the hierarchy selection control signal filters the UpDR and ShDR control signals applied to non-hierarchy-enabling components 410₃ and 410₄ of the second hierarchical level, thereby preventing a bitstream being propagated through the components of the first hierarchical level (A0→SIB→A1) from being propagated though the non-hierarchy-enabling components of the second hierarchical level (i.e., the registers of boundary scan cells B0 and B1 hold their respective values that were loaded into boundary scan cells B0 and B1 before the second hierarchical level was dynamically deselected by SIB cell 420 to remove the second hierarchical level from the active scan path).

The filtering of control signals normally applied to components of the second hierarchical level of a scan path in a manner for isolating the second hierarchical level from the scan path provides numerous advantages.

First, control signal filtering as depicted and described herein provides power consumption savings because components of the second hierarchical level are no longer passing and storing signals when the second hierarchical level is deselected (as opposed to existing systems where deselection of the second hierarchical level did not prevent bits from being propagated through the second hierarchical level).

Second, control signal filtering as depicted and described herein enables use of the second hierarchical level for independent, parallel testing (where it could not otherwise be used in this manner). In other words, since the control signal filtering prevents propagation of bitstreams from the first hierarchical level to the second hierarchical level, the first hierarchical level and second hierarchical levels are effectively isolated such that different tests may be performed in the different hierarchal levels in parallel.

Figure 5A:
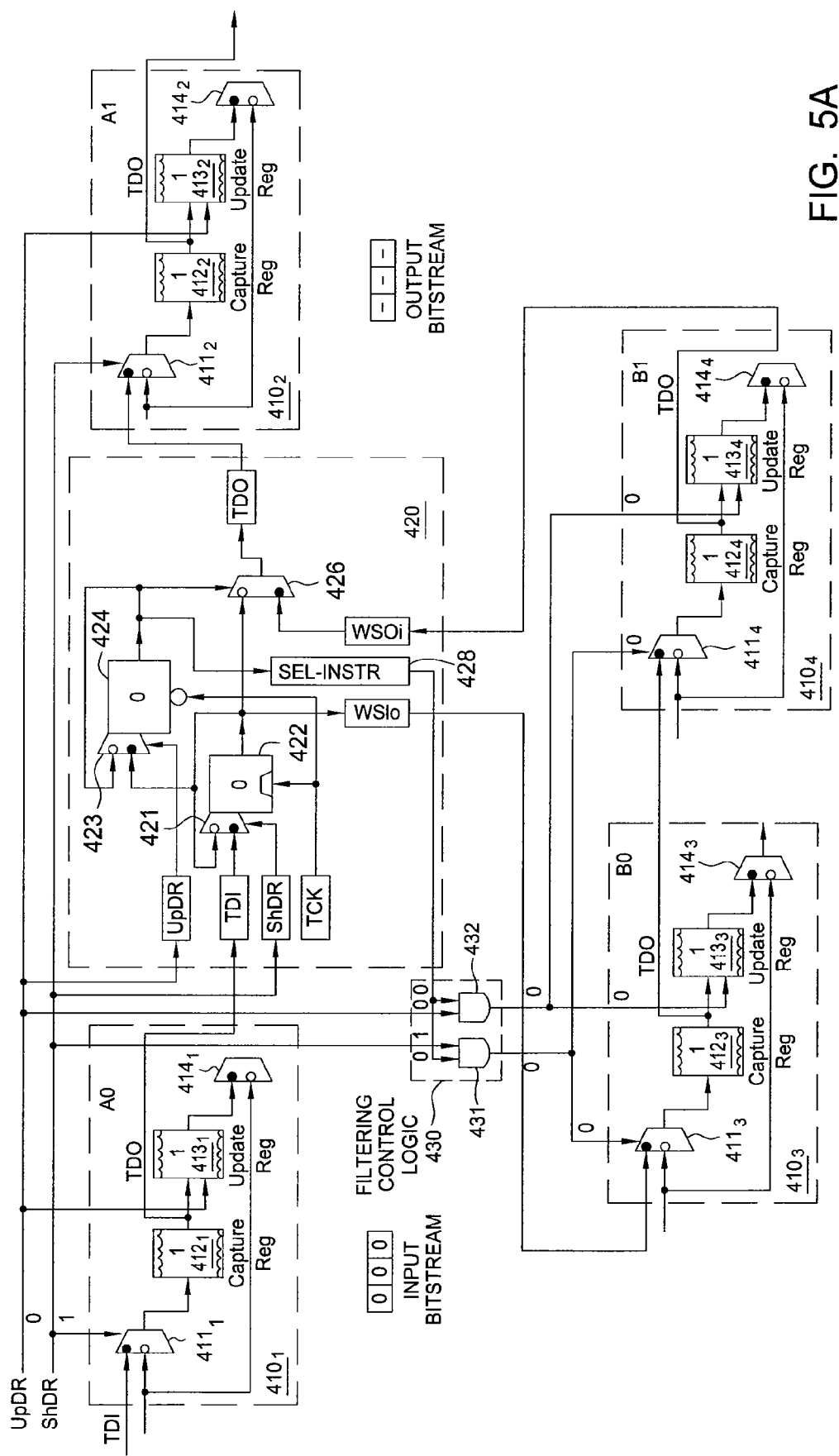
FIG. 5A-5E depicts an example of using filtering control logic to filter control signals in the system-on-chip of FIG. 4.
Figure 5B:
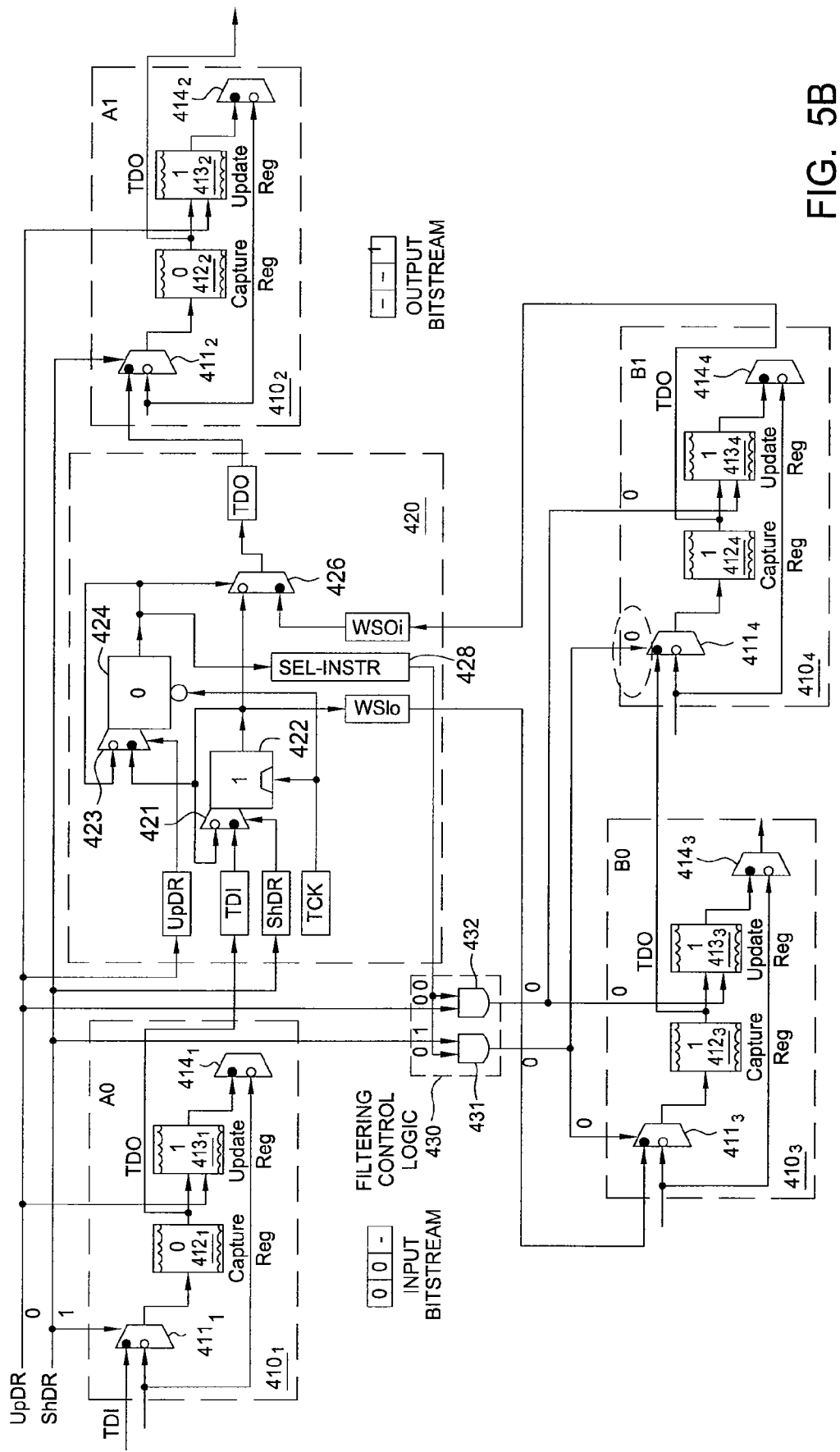
Figure 5C:
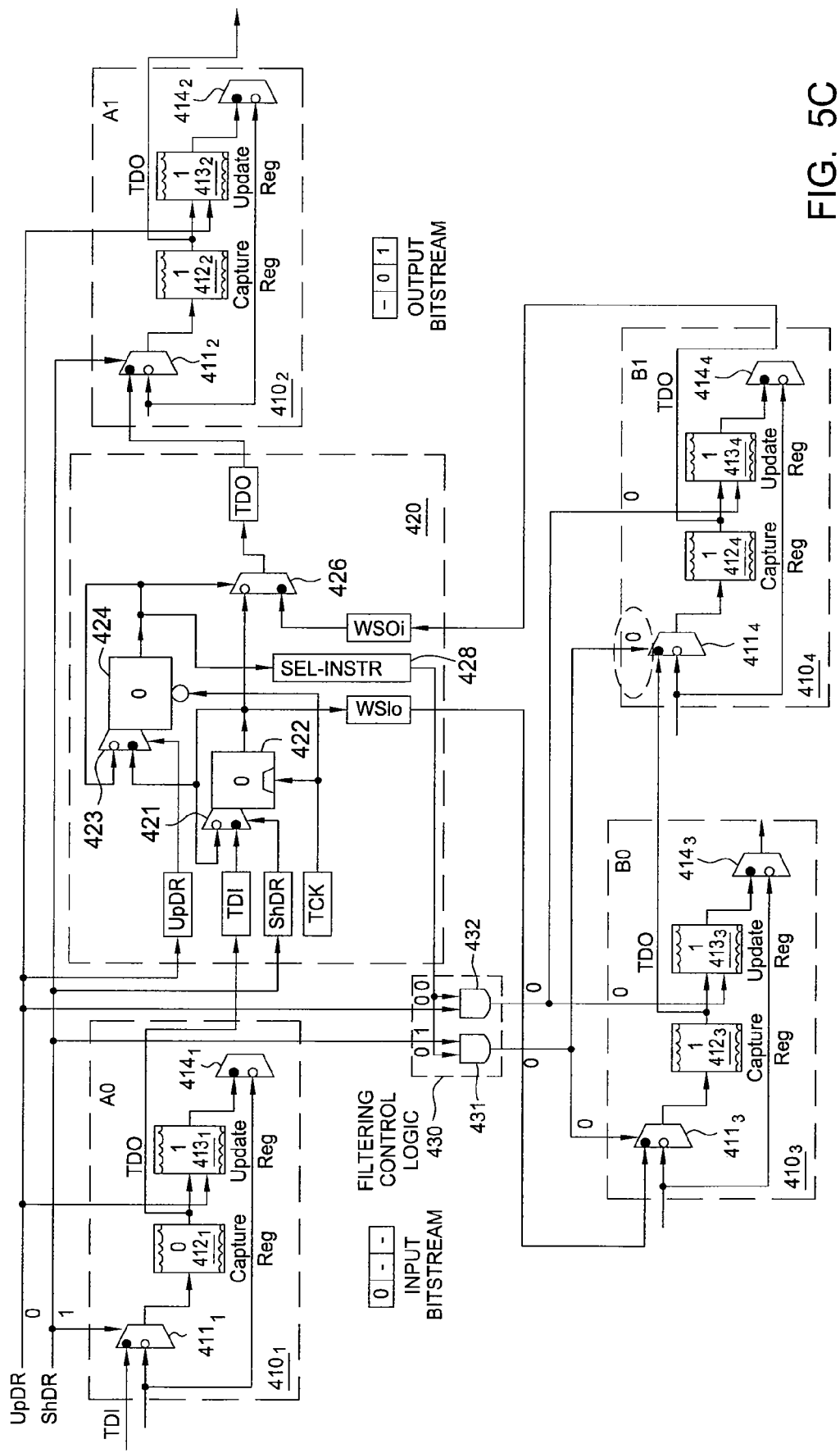
Figure 5D:
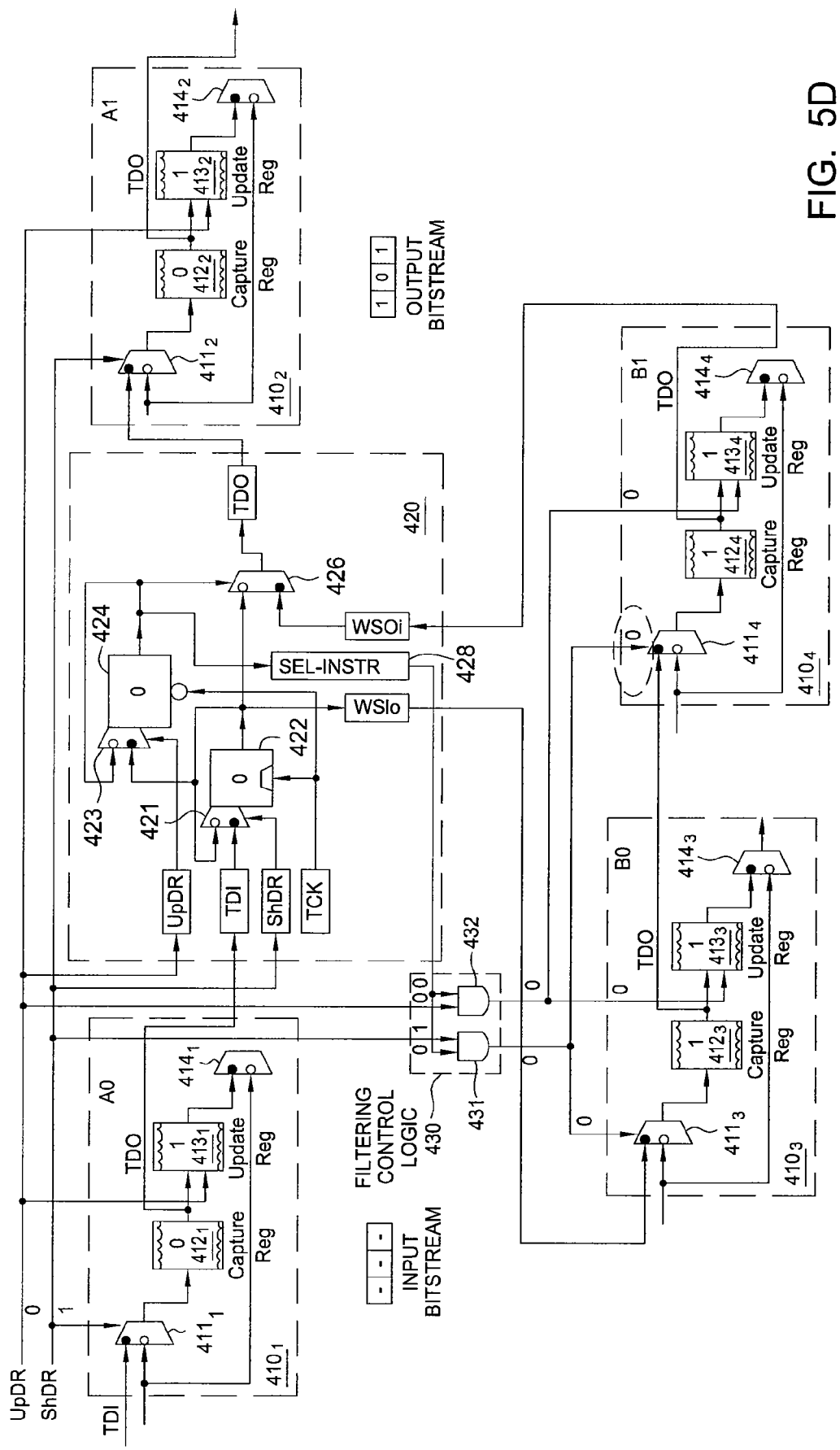
Figure 5E:
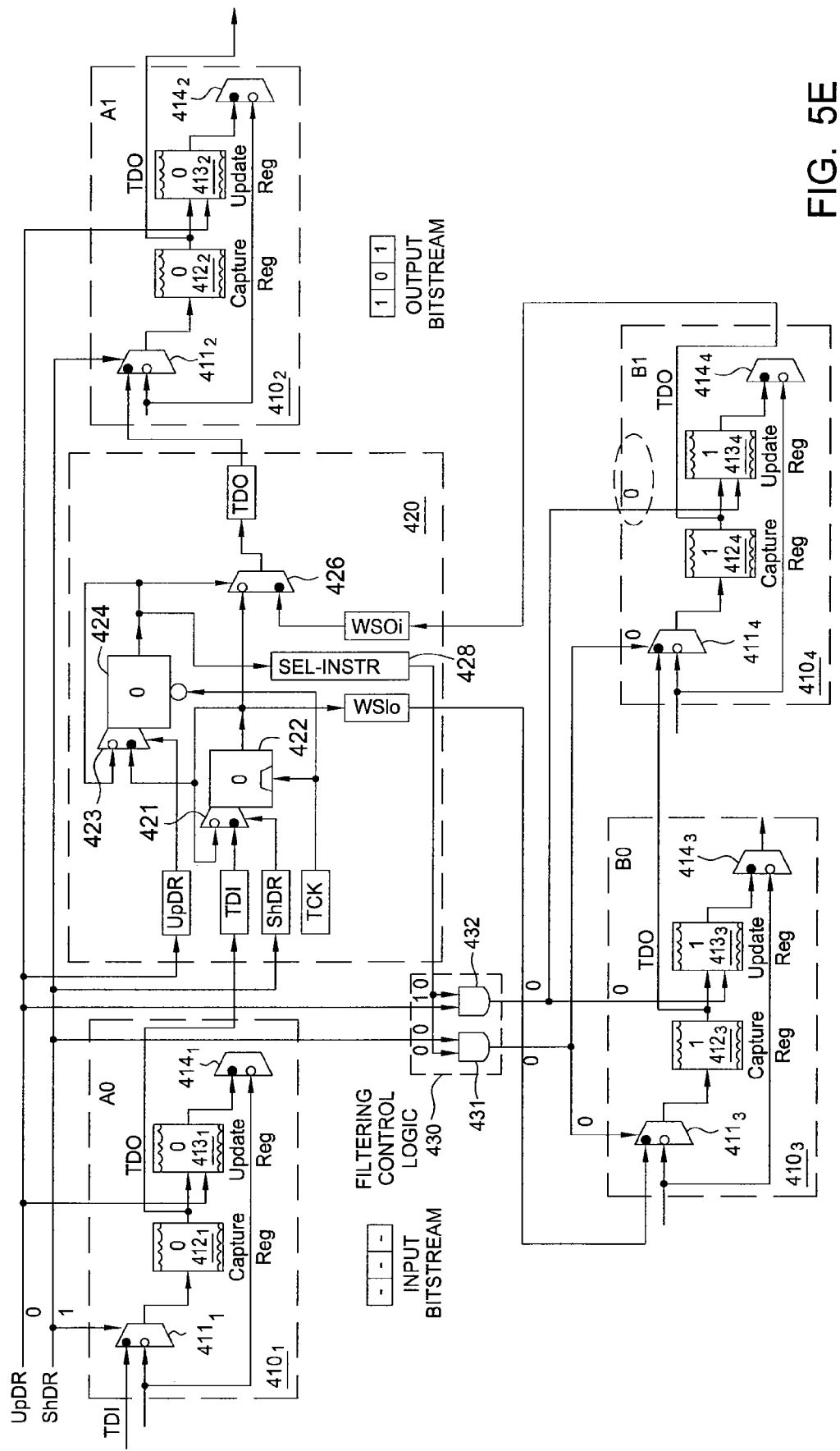
Figure 6:
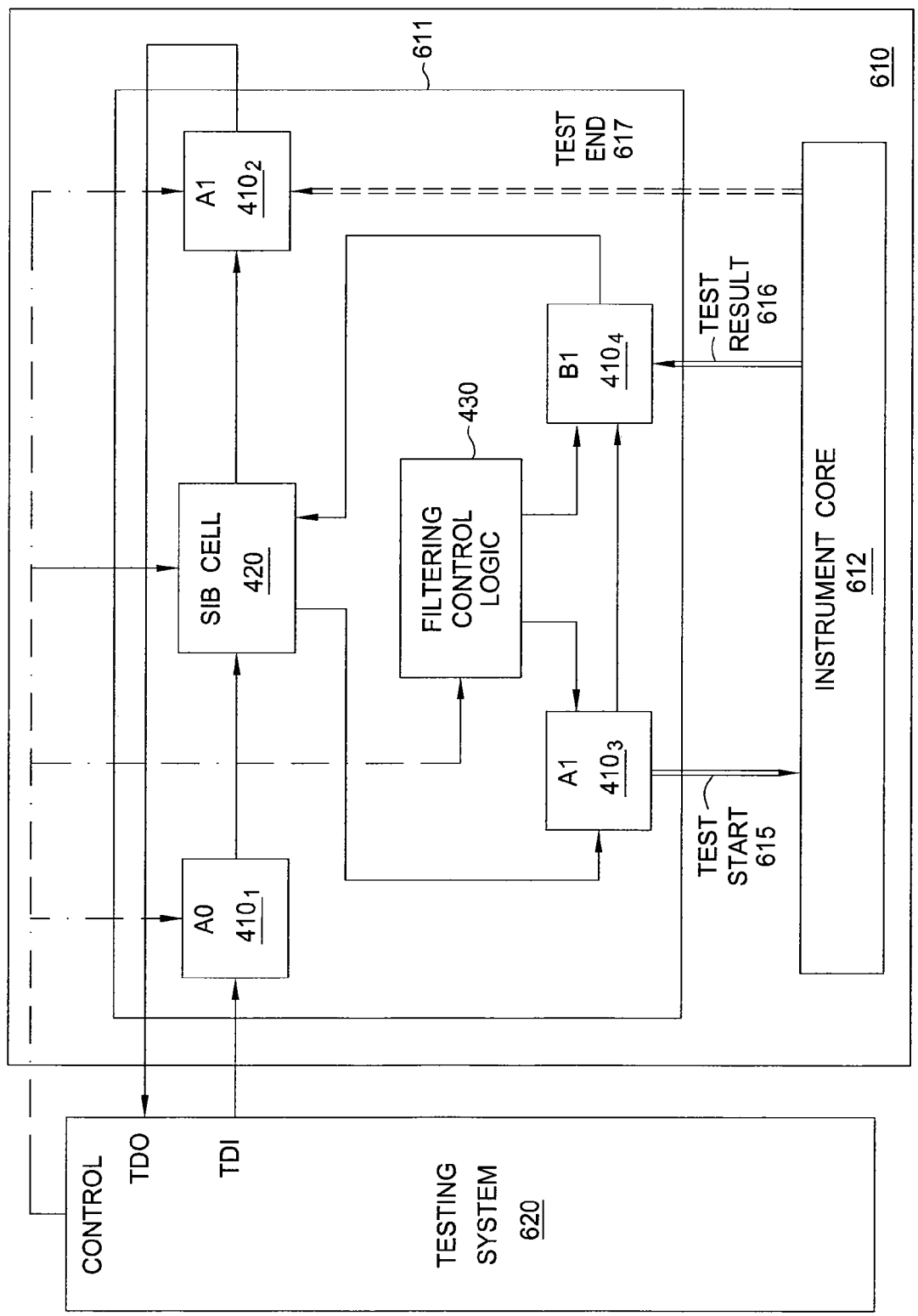
FIG. 6 depicts a testing system including a testing system and a system-on-chip including a hierarchical scan path and an instrument core adapted for being tested through the hierarchical scan path.

These advantages, as well as other advantages of the control signal filtering depicted and described herein, may be better understood with respect to the example of FIG. 5A-FIG. 5E (which present examples of the operation of system-on-chip 400 depicted and described with respect to FIG. 4) and the embodiment of FIG. 6 (which presents an exemplary use of control filtering logic for enabling parallel testing via the second hierarchical level).

FIG. 5A-5E depicts an example of using filtering control logic to filter control signals in the system-on-chip of FIG. 4.

FIG. 5A depicts an initial state of system-on-chip 400. In this example, assume that (1) the capture registers and update registers of boundary scan cells A0 and A1 are each set to "1", and (2) the SIB register 422 and UpSIB register 424 of SIB cell 420 are each set to "0" (and, thus, that the second hierarchical level of the scan path has been deselected). Further, assume that before the second hierarchical level was deselected by setting UpSIB register 424 to "0", values were propagated into the boundary scan cells B0 and B1 of the second hierarchical level (illustratively, that the capture registers and update registers of boundary scan cells B0 and B1 were each set to "1").

As depicted in FIG. 5A, ShDR is set to "1" and UpDR is set to "0". In this example, an input bitstream of "000" will be applied to the TDI input of the system-on-chip 400 and an associated output bitstream will be recovered from the TDO output of the system-on-chip 400.

FIG. 5B depicts the state of system-on-chip 400 after a first clock cycle (with ShDR="1" and UpDR="0").

As depicted in FIG. 5B, the first bit (i.e., a "0") of the input bitstream has propagated from the TDI input of boundary scan cell A0 to the capture register 411₁ of boundary scan cell A0, the value ("1") stored in the capture register 412₁ of boundary scan cell A0 has been propagated to the TDI input of SIB cell 420 and stored in the SIB register 422 of SIB cell 420, the value ("0") stored in the SIB register 422 of SIB cell 420 has been propagated to the capture register 412₂ of boundary scan cell A1 via the TDO output of SIB cell 420 and the input MUX 411₂ of boundary scan cell A1, and the value ("1") stored in the capture register 412₂ of boundary scan cell A1 has been propagated to the TDO output of boundary scan cell A1 (which is also the TDO output of system-on-chip 400). Thus, the first bit of the output bitstream is a "1".

As further depicted in FIG. 5B, since UpDR is set to "0", the values of the update registers 413₁ and 413₂ of respective boundary scan cells A0 and A1 (namely, "1") remain unchanged, and the value of UpSIB register 424 of SIB cell 420 ("0") remains unchanged (and, thus, the second hierarchical level remains deselected).

As depicted in FIG. 5B, even though ShDR is "1", the first AND gate 431 of filtering control logic 430 also takes the value of the UpSIB register 424 (namely, "0") as an input and, thus, the output of the first AND gate 431 is "0". The output of the first AND gate 431 is applied as a control signal to input MUXs 411₃ and 411₄ of the respective boundary scan cells B0 and B1 of the second hierarchical level, thereby preventing the value on the WSIo port of SIB cell 420 from being propagated into the capture register 412₃ of boundary scan cell B0, preventing the value from the capture register 412₃ of boundary scan cell B0 from being propagated into the capture register 412₄ of boundary scan cell B1, and preventing the value from the capture register 412₄ of boundary scan cell B1 from being propagated to boundary scan cell A0 via the WSOi port and the TDO output of SIB cell 420 (i.e., thereby preventing propagation of data values from the first hierarchical level to the second hierarchical level while the second hierarchical level is deselected).

Similarly, as depicted in FIG. 5B, regardless of the fact that UPDR is set to "0", the second AND gate 432 also takes the value of the UpSIB register 424 (namely, "0") as an input and, thus, the output of the second AND gate 432 is "0". The output of the second AND gate 431 is applied as a control signal to update registers 413₃ and 413₄ of respective boundary scan cells B0 and B1 of the second hierarchical level, thereby preventing the values stored in the capture registers 412₃ and 412₄ from being propagated into the update registers 413₃ and 413₄ of boundary scan cells B0 and B1, respectively (i.e., thereby preventing propagation of data within cells 410₃ and 410₄ of the second hierarchical level while the second hierarchical level is deselected).

FIGS. 5C and 5D depict the state of system-on-chip 400 after second and third clock cycles, respectively (with ShDR="1" and UPDR="0"). In FIGS. 5C and 5D, the input bitstream continues to be propagated through the components of the first hierarchical level of the scan path while values stored within each component of the second hierarchical level remain unchanged. In FIGS. 5C and 5D, propagation of signals through the components of the first hierarchical level proceeds in a manner similar to that depicted and described with respect to FIG. 5B (and, therefore, a detailed description is omitted). For purposes of clarity, values associated with components of the scan path of the system-on-chip 400 at each clock cycle are summarized in Table 1.

TABLE 1

| Component | Initial State (ShDr = 1, UpDR = 0) | First Clock (ShDr = 1, UpDR = 0) | Second Clock (ShDr = 1, UpDR = 0) | Third Clock (ShDr = 1, UpDR = 0) | Fourth Clock (ShDr = 0, UpDR = 1) |
|---|---|---|---|---|---|
| TDI | — | 0 | 0 | 0 | — |
| A0 (Cap Reg) | 1 | 0 | 0 | 0 | 0 |
| A0 (Upd Reg) | 1 | 1 | 1 | 1 | 0 |
| SIB (SIB) | 0 | 1 | 0 | 0 | 0 |
| SIB (UpSIB) | 0 | 0 | 0 | 0 | 0 |
| A1 (Cap Reg) | 1 | 0 | 1 | 0 | 0 |
| A1 (Upd Reg) | 1 | 1 | 1 | 1 | 0 |
| TDO | — | 1 | 0 | 1 | — |
| B0 (Cap Reg) | 1 | 1 | 1 | 1 | 1 |
| B0 (Upd Reg) | 1 | 1 | 1 | 1 | 1 |
| B1 (Cap Reg) | 1 | 1 | 1 | 1 | 1 |
| B1 (Upd Reg) | 1 | 1 | 1 | 1 | 1 |

Thus, from FIG. 5A-FIG. 5D, and associated Table 1 provided above, the filtering control logic 430 of the system-on-chip 400 is adapted to ensure that, while the second hierarchical level remains deselected by SIB cell 420, the values stored within each component of the second hierarchical level (i.e., within registers of boundary scan cells B0 and B1) remain unchanged as an input bitstream continues to be propagated through the first hierarchical level (i.e., thorough boundary scan cell A0, SIB cell 420, and boundary scan cell A1) to produce a corresponding output bitstream.

As depicted in FIG. 5E, after each bit of the input bitstream ("000") has been applied to the system-on-chip 400 (via the TDI input from the testing system) and each bit of the corresponding output bitstream ("101") has been captured from the system-on-chip 400 (via the TDO output to the testing system), ShDR is switched from "1" to "0" and UpDR is switched from "0" to "1". This causes the value of capture register $412_1$ of boundary scan cell A0 to be stored in update register $413_1$ of boundary scan cell A0 and causes the value of capture register $412_2$ of the boundary scan cell A1 to be stored in the update register $413_2$ of boundary scan cell A1.

As depicted in FIG. 5E, regardless of the fact that ShDR is "0", the first AND gate 431 also takes the value of the UpSIB register 424 (namely, "0") as an input and, thus, the output of the first AND gate 431 is "0". The output of the first AND gate 431 is applied as a control signal to input MUXs $411_3$ and $411_4$ of the respective boundary scan cells B0 and B1 of the second hierarchical level, thereby preventing the value on the WSIo port of the SIB cell 420 from being propagated into the capture register $412_3$ of boundary scan cell B0, preventing the value from the capture register $412_3$ of boundary scan cell B0 from being propagated into the capture register $412_4$ of boundary scan cell B1, and preventing the value from the capture register $412_4$ of boundary scan cell B1 from being propagated to boundary scan cell A0 via the WSOi port and the TDO output of SIB cell 420 (i.e., thereby preventing propagation of data within the second hierarchical level while data continues to be propagated through the first hierarchical level).

Similarly, as depicted in FIG. 5E, even though UpDR is "1", the second AND gate 432 also takes the value of the UpSIB register 424 (namely, "0") as an input and, thus, the output of the second AND gate 432 is "0". The output of the second AND gate 431 is applied as a control signal to update registers $413_3$ and $413_4$ of the respective boundary scan cells B0 and B1 of the second hierarchical level, thereby preventing values stored in capture registers $412_3$ and $412_4$ of boundary scan cells B0 and B1 from being propagated to update registers $413_3$ and $413_4$ of boundary scan cells B0 and B1, respectively (i.e., thereby preventing propagation of data within cells $410_3$ and $410_4$ of the second hierarchical level while data continues to be propagated through the first hierarchical level).

FIG. 6 depicts a testing environment including a testing system and a system-on-chip including a hierarchical scan path and an instrument core adapted for being tested through the hierarchical scan path. As depicted in FIG. 6, the testing system 600 includes a system-on-chip 610 and a testing system 620. The system-on-chip 610 includes a system-on-chip 611 and an instrument core 612. The system-on-chip 611 is substantially similar to the system-on-chip 400 depicted and described with respect to FIG. 4 (including additional interfaces to instrument core 612). The instrument core 612 may include any type of instrument adapted for being tested via a scan path using IJTAG.

As described herein, filtering control logic 430 enables the instrument core 612 to be tested in parallel with other testing that is being performed via the first hierarchical level of system-on-chip 611.

The testing system 620 selects SIB cell 420 such that the second hierarchical level of system-on-chip 611 is active within the scan path of system-on-chip 611. As described herein, upon selection of the second hierarchical level, values may be read into boundary scan cells B0 and B1 of the second hierarchical level (because the filtering control logic 430 is not filtering the ShDR and UpDR control signals). The testing system 620 applies an input bitstream to the TDI input of system-on-chip 611, causing input bitstream values to be propagated along the scan path A0→SIB CELL→B0→B1→SIB CELL→A1. This enables desired values to be loaded into the capture and update registers of the boundary scan cells B0 and B1 of the second hierarchical level.

The testing system 620, after loading desired values into boundary scan cells B0 and B1 of the second hierarchical level, deselects SIB cell 420 such that input bitstream values may continue to be propagated through the first hierarchical level (A0→SIB CELL→A1) without modifying the values of boundary scan cells B0 and B1 of the second hierarchical level (i.e., filtering control logic 430 prevents the propagation of input bitstreams to the second hierarchical level by filtering ShDR and UpDR control signals, as depicted and described herein, effectively isolating the second hierarchical level from the scan path of system-on-chip 611).

As depicted in FIG. 6, the value(s) loaded into boundary scan cell B0 is applied to the instrument core 612 in order to initiate one or more tests on the instrument core 612 (illustratively, as TEST START signal 615 applied from boundary scan cell B0 to instrument core 612).

In this manner, instrument core 612 is being tested while the testing system 620 continues to apply input bitstreams to the first hierarchical level in order to perform other tests on system-on-chip 610 (e.g., testing connections, testing other IPs/instruments, and the like, as well as various combinations thereof). Thus, use of filtering control logic 430 to isolate the second hierarchical level from the first hierarchical level enables parallel testing to be performed on the system-on-chip 610, thereby resulting in a reduction in the time required for testing system 620 to test the system-on-chip 610.

As depicted in FIG. 6, following completion of testing of instrument core 612, instrument core 612 provides testing results to system-on-chip 611 for propagation back to testing system 620. As depicted in FIG. 6, instrument core 612 provides the test results to boundary scan cell B1 (illustratively, as TEST RESULT signal(s) 616), which may then propagate the test results to testing system 620. In order to propagate the test results from boundary scan cell B0 of the second hierarchical level to the testing system 620, the second hierarchical level must be reselected such that it is again added to the scan chain of system-on-chip 611. The testing system 620 reselects SIB cell 420, thereby adding the second hierarchical level back to the scan path of system-on-chip 611. The testing system 620 then applies signals adapted for causing the test results to be propagated along the scan path from boundary scan cell B1 to testing system 620 (i.e., along the path B1→SIB CELL→A1→TDO).

In order for testing system 620 to control propagation of test results from instrument core 612 to testing system 620, testing system 620 needs to be able to determine when the second hierarchical level should be reselected for inclusion in the scan path of system-on-chip 611. This can be performed in a number of ways.

In one embodiment, testing system 620 knows apriori the length of time required to perform testing of the instrument core 612 (e.g., the required number of clock cycles). In this embodiment, testing system 620 may simply keep track of the length of time during which the instrument core 612 is being tested (e.g., by counting clock cycles) so that the testing system 620 knows exactly when testing results are available from instrument core 612. In this embodiment, upon determining that the testing of instrument core 612 is complete, testing system 620 initiates signaling that is adapted to reselect the second hierarchical level, thereby enabling the testing results from the instrument core 612 to be propagated along the scan path to testing system 620 (i.e., along the path B1→SIB CELL→A1→TDO).

In one embodiment, testing system does not know the length of time required to perform testing of the instrument core 612. In this embodiment, testing system 620 may check for a signal from the instrument core 612 indicating that testing is complete (i.e., that testing results are available from instrument core 612). In one embodiment, the testing complete control signal may be provided from instrument core 612 to one of the components of the first hierarchical level (illustratively, optional TEST END signal 617 provided from instrument core 612 to boundary scan cell A1) for propagation to testing system 620. The testing complete control signal may include one or more bits set in a manner for conveying an indication that testing of instrument core 612 is complete and that test results are available. This may be better understood with respect to the following example.

In one embodiment, for example, the scan path of system-on-chip 610 may be composed of a first segment (S1) of cells (having 15 cells) connected to a TDI input, a second segment (S2) of cells (having 5 cells) connected to a TDO output, an SIB cell disposed between S1 and S2, and a third segment (S3) of cells (having 80 cells) in a hierarchical derivation of the SIB cell and connected to instrument core 612. In this example, S1-SIB-S2 forms a first hierarchical level and S3 forms a second hierarchical level controlled by the SIB cell. In this example, assume that the first cell of S2 would receive and store the TEST END signal 617.

In this example, one operation which may be performed by testing system 620 may include the following: (1) select S3 by setting the SIB cell to "1"; (2) loading values into S1-S2-S3 by accessing the scan path in which both the first and second hierarchical levels are active (where the scan path is now composed of 101 elements (15+1+80+5); (3) load into S3 a value that will begin the operation; (4) deselect S3 by setting the SIB cell to "0"; (5) access the scan path, now composed of S1-SIB-S2 (having 21 elements), to continue testing while S3 is completing its operation independent of testing in the first hierarchical level; (6) monitor the value of the first bit of S2 (i.e., bit 17 in the current scan path since the second hierarchical level is deselected) because instrument core 612 sets the value of the first bit of S2 to "1" when instrument core 612 has finished its operation; and (7) reselect S3 (SIB=1); and (8) collect the results from the scan path (which now includes 101 elements).

In this manner, testing system 620 is able to perform parallel testing via the second hierarchical level while continuing to perform other testing in the first hierarchical level. A method according to one such embodiment is depicted and described herein with respect to FIG. 7.

Figure 7:
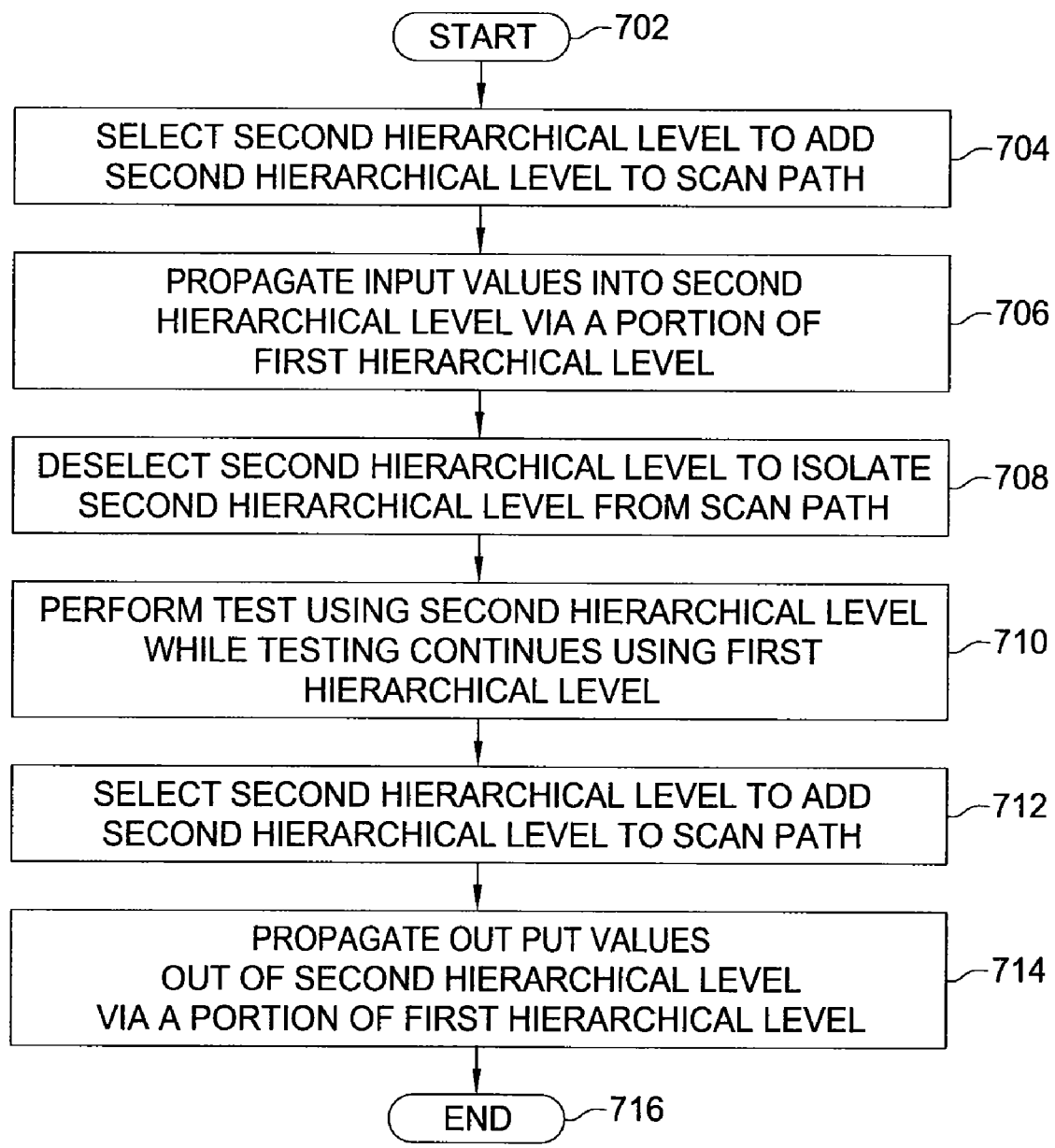
FIG. 7 depicts an exemplary method by which a testing system tests a system-on-chip having a scan path that includes a first hierarchical level and a second hierarchical level.

FIG. 7 depicts an exemplary method according to one embodiment. Specifically, method 700 of FIG. 7 includes a method by which a testing system tests a system-on-chip having a scan path that includes a first hierarchical level and a second hierarchical level. Although depicted and described as being performed serially, at least a portion of the steps of method 700 of FIG. 7 may be performed contemporaneously, or in a different order than depicted and described with respect to FIG. 7. The method 700 begins at step 702 and proceeds to step 704.

At step 704, the second hierarchical level of the system-on-chip is selected to add it to the scan path of the system-on-chip. At step 706, an input value(s) is propagated from the testing system to the second hierarchical level. The input value(s) is propagated from the testing system to the second hierarchical level via at least a portion of the first hierarchical level. At step 708, the second hierarchical level of the system-on-chip is deselected, thereby isolating the second hierarchical level from the scan path of the system-on-chip.

At step 710, a test is performed via the second hierarchical level while testing continues to be performed via the first hierarchical level (i.e., as other values continue to be propagated through the first hierarchical level without being propagated through the second hierarchical level). The test performed via the second hierarchical level is performed using the input value(s). The test performed via the second hierarchical level produces an output value(s). The test may include any test (e.g., testing connections, instruments, and the like, as well as various combinations thereof).

At step 712, the second hierarchical level of the system-on-chip is selected to add it to the scan path of the system-on-chip. At step 714, the output value(s) is propagated from the second hierarchical level to the testing system. The output value(s) is propagated from the second hierarchical level to the testing system via at least a portion of the first hierarchical level (which may include a different portion of the first hierarchical level than was used to propagate the input value(s) to the second hierarchical level).

At step 716, method 700 ends. Although depicted and described herein as ending (for purposes of clarity), method 700 may continue to be performed as desired/needed for purposes of testing the system-on-chip. The method 700 may continue to be performed for the second hierarchical level, as well as for other hierarchical levels which may be supported by the system-on-chip.

Although primarily depicted and described with respect to use of a specific hierarchy-enabling component to control the selection/deselection of hierarchical levels of a scan path (namely, the SIB cell as defined in the proposed IEEE P1687 standard), any hierarchy-enabling component may be used to control the selection/deselection of hierarchical levels of a scan path and, thus, filtering control logic depicted and described herein may be implemented in any manner adapted for preventing propagation of bitstream values through a second hierarchical level of the scan path (when the second hierarchical level is deselected) while bitstream values continue to be propagated through a first hierarchical level of the scan path.

Although primarily depicted and described herein with respect to using one hierarchy selection control signal for filtering the ShDR and UpDR control signals (illustratively, the value of the UpSIB register of a SIB cell), in other embodiments multiple hierarchy selection control signals may be used in order to filter the ShDR and UpDR control signals in a manner for preventing propagation of data in the second hierarchical level of a scan path while data continues to be propagated in the first hierarchical level of the scan path. In such embodiments, the multiple hierarchy selection control signals may be utilized in any manner (which may depend on the design/operation of the hierarchy-enabling component used for selecting/deselecting the second hierarchical level of the scan path). In such embodiment, the use of multiple hierarchy selection control signals may require use of different filtering control logic.

Although primarily depicted and described herein with respect to using specific control logic to implement control signal filtering functions depicted and described herein, any control logic may be used to implement the control signal filtering functions depicted and described herein. The filtering control logic may include any control logic adapted for filtering control signals from being applied to the second hierarchical level in a manner for isolating the second hierarchical level from an associated first hierarchical level. In other words, the filtering control logic may include any control logic adapted for isolating the second hierarchical level from the scan path of a system-on-chip (i.e., such that bitstreams do not propagate within the second hierarchical level while the second hierarchical level is deselected).

Although primarily depicted and described herein with respect to a scan path including a specific combination of components, the control signal filtering functions depicted and described herein may be implemented for a scan path including various other combinations of components. Although primarily depicted and described herein with respect to two hierarchical levels (namely, a first hierarchical level and a second hierarchical level), the control signal filtering functions depicted and described herein may be implemented for a system-on-chip having any number and/or combination of hierarchical levels (e.g., N level arranged in any configuration).

In one embodiment, for example, a system-on-chip apparatus includes: (1) a testing scan path comprising N hierarchical levels, wherein a first hierarchical level comprises a primary level, wherein N−1 hierarchical levels of the N hierarchical levels are each adapted for being dynamically selected and deselected, wherein selection and deselection of an $(n)^{th}$ hierarchical layer is controlled by an $(n-1)^{th}$ hierarchical layer, and (2) control logic adapted for filtering application of at least one control to each deselected hierarchal level in a manner for preventing propagation of data within each deselected hierarchical layer while data is propagated within each selected hierarchical layer.

Figure 8:
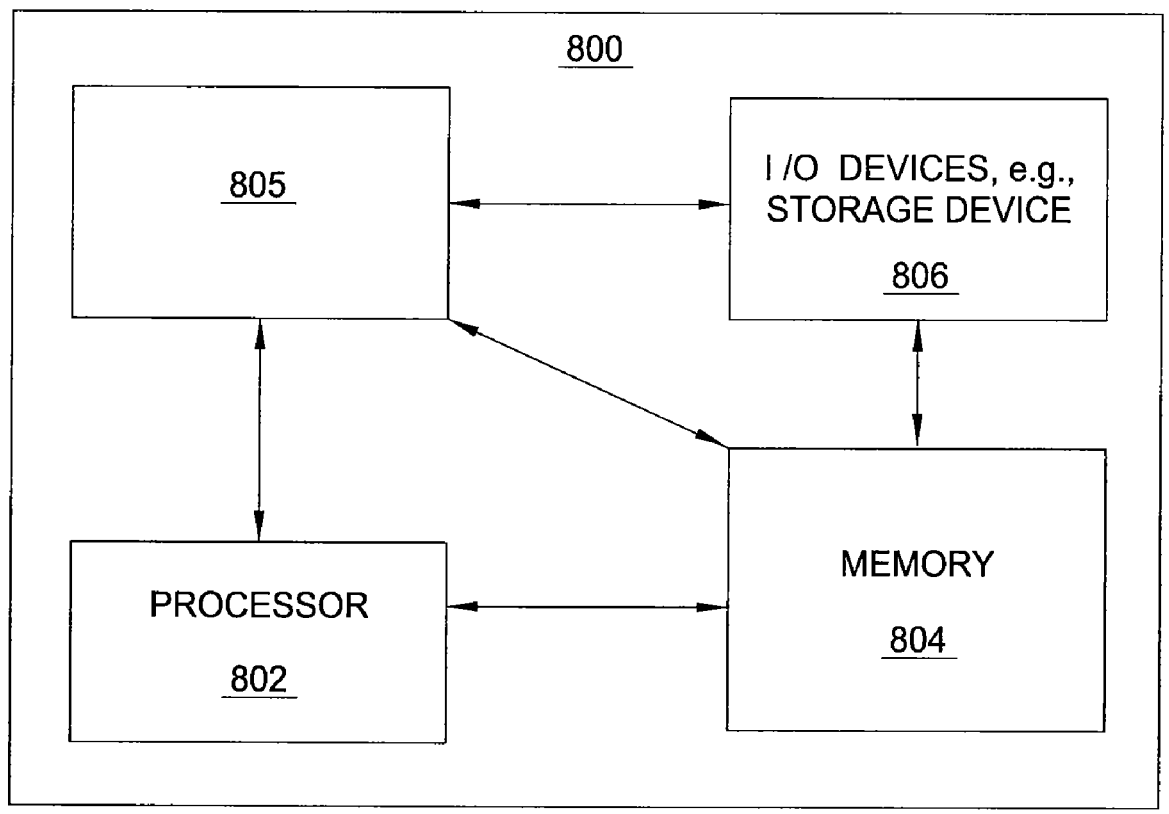
FIG. 8 depicts a high-level block diagram of a general-purpose computer suitable for use in performing the functions described herein.

FIG. 8 depicts a high-level block diagram of a general-purpose computer suitable for use in performing the functions described herein. As depicted in FIG. 8, system 800 comprises a processor element 802 (e.g., a CPU), a memory 804, e.g., random access memory (RAM) and/or read only memory (ROM), a testing control module 805, and various input/output devices 806 (e.g., storage devices, including but not limited to, a tape drive, a floppy drive, a hard disk drive or a compact disk drive, a receiver, a transmitter, a speaker, a display, an output port, and a user input device (such as a keyboard, a keypad, a mouse, and the like)).

It should be noted that the present invention may be implemented in software and/or in a combination of software and hardware, e.g., using application specific integrated circuits (ASIC), a general purpose computer or any other hardware equivalents. In one embodiment, the present testing control process 805 can be loaded into memory 804 and executed by processor 802 to implement the functions as discussed above. As such, testing control process 805 (including associated data structures) of the present invention can be stored on a computer readable medium or carrier, e.g., RAM memory, magnetic or optical drive or diskette, and the like.

Although various embodiments which incorporate the teachings of the present invention have been shown and described in detail herein, those skilled in the art can readily devise many other varied embodiments that still incorporate these teachings.

What is claimed is:

1. A system-on-chip apparatus, the apparatus comprising:
   a scan path comprising a first layer having a plurality of components, and a second layer having at least one component, wherein the second layer is adapted for being dynamically selected and deselected;
   wherein propagation of data within the first layer is controlled using at least one control signal;
   wherein propagation of data within the second layer is controlled using the at least one control signal and a layer selection control signal from the first layer, wherein the layer selection control signal is adapted for controlling propagation of data within the second layer independent of propagation of data within the first layer.

2. The apparatus of claim 1, wherein each of the components of the first layer include a hierarchy-enabling component adapted for selecting and deselecting the second layer, wherein the at least one component of the second layer includes at least one non-hierarchy-enabling component.

3. The apparatus of claim 2, wherein each of the at least one hierarchy-enabling component is adapted for generating a layer selection control signal adapted for selecting and deselecting the second layer.

4. The apparatus of claim 3, further comprising a control logic adapted for using a layer selection control signal from the hierarchy-enabling component to filter application of the at least one control signal to the at least one non-hierarchy-enabling component of the second layer.

5. The apparatus of claim 4, wherein the layer selection control signal comprises a first control signal and a second control signal.

6. The apparatus of claim 5, wherein the at least one non-hierarchy-enabling component of the second layer comprises a first register and a second register.

7. The apparatus of claim 6, wherein the control logic comprises a first portion for controlling the first register of the at least one non-hierarchy-enabling component and a second portion for controlling the second register of the at least one non-hierarchy-enabling component.

8. The apparatus of claim 7, wherein the first portion of the control logic comprises a first AND gate, wherein a first input to the first AND gate is the first control signal and a second input to the first AND gate is the hierarchy selection control signal.

9. The apparatus of claim 8, wherein an output of the first AND gate is coupled to the at least one non-hierarchy-enabling component of the second layer as a first shift control signal adapted for controlling shifting of data into the first register.

10. The apparatus of claim 9, wherein the second portion of the control logic comprises a second AND gate, wherein a first input to the second AND gate is the second control signal and a second input to the second AND gate is the layer selection control signal.

11. The apparatus of claim 10, wherein an output of the second AND gate is coupled to the at least one non-hierarchy-enabling component of the second layer as a second shift control signal adapted for controlling shifting of data into the second register.

12. A system-on-chip apparatus, the apparatus comprising:
a scan path comprising a plurality of segments communicatively coupled to one or more input and output (I/O) ports of the system-on-chip, a derivation-enabling cell coupled to one or more segments wherein said derivation-enabling cell is disposed between two segments and a third segment of the plurality of segments to thereby form a multi-level derivation; and
control logic for enabling access to one or more cores with a single scan operation that controls configuration of the entire scan path, the one or more cores being coupled to the plurality of segments.

13. The system of claim 12, wherein each of the plurality of segments further comprises a single layer on a level as well as one or more hierarchical or subordinate levels.

14. The apparatus of claim 13, wherein a first hierarchical level comprises a plurality of components and a second hierarchical level comprises at least one component, wherein data is propagated within the first hierarchical level using at least one control signal applied to the components of the first hierarchical level.

15. The apparatus of claim 14, wherein the at least one component of the second hierarchical level includes at least one non-hierarchy-enabling component.

16. The apparatus of claim 15, wherein the control logic is adapted for using a hierarchy selection control signal from the hierarchy-enabling component to filter application of the at least one control signal to the at least one non-hierarchy-enabling component of the second hierarchical level.

17. The apparatus of claim 15, wherein the at least one non-hierarchy-enabling component of the second hierarchical level is coupled to an instrument, wherein the control logic prevents data from being propagated within the second hierarchical level when the second hierarchical level is deselected to enable thereby parallel testing of the instrument while data continues to be propagated through the first hierarchical level.

18. The apparatus of claim 17, wherein the instrument is adapted to provide a testing result to at least one of the at least one non-hierarchy-enabling component of the second hierarchical level.

19. The apparatus of claim 13, wherein, when the second hierarchical level is deselected, the control logic prevents data from being propagated within the second hierarchical level while data is propagated within the first hierarchical level.

20. The apparatus of claim 13, wherein, when the second hierarchical level is selected, the control logic allows data to be propagated within the second hierarchical level while data is propagated within the first hierarchical level.

21. The apparatus of claim 13, wherein the components of the first hierarchical level include a hierarchy-enabling component adapted for selecting and deselecting the second hierarchical level.

* * * * *